United States Patent
Ichikawa

(10) Patent No.: US 10,220,779 B2
(45) Date of Patent: *Mar. 5, 2019

(54) VEHICULAR LIGHTING DEVICE

(71) Applicant: Koito Manufacturing Co., Ltd., Tokyo (JP)

(72) Inventor: Tomoyuki Ichikawa, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/610,663

(22) Filed: Jun. 1, 2017

(65) Prior Publication Data

US 2017/0267175 A1   Sep. 21, 2017

(30) Foreign Application Priority Data

Dec. 3, 2014  (JP) ................................ 2014-245183
Dec. 11, 2014 (JP) ................................ 2014-251180

(51) Int. Cl.
| | |
|---|---|
| *B60Q 1/04* | (2006.01) |
| *B60Q 11/00* | (2006.01) |
| *H01L 31/02* | (2006.01) |
| *H01L 31/10* | (2006.01) |
| *F21S 41/14* | (2018.01) |

(Continued)

(52) U.S. Cl.
CPC .............. *B60Q 11/005* (2013.01); *B60Q 1/04* (2013.01); *B60Q 11/00* (2013.01); *F21S 41/14* (2018.01);

(Continued)

(58) Field of Classification Search
CPC ......... B60Q 11/005; B60Q 1/04; F21S 41/14; F21S 41/32; G01J 1/0238; G01J 1/4228; F21Y 2115/30; F21V 23/003
See application file for complete search history.

(56) References Cited

U.S. PATENT DOCUMENTS

| | | | |
|---|---|---|---|
| 2011/0116520 A1 | 5/2011 | Marcellinus et al. | |
| 2014/0009952 A1* | 1/2014 | Nomura | ................... H01S 5/00 362/509 |

FOREIGN PATENT DOCUMENTS

| | | |
|---|---|---|
| DE | 10 2012 215702 A1 | 3/2014 |
| DE | 10 2012 220481 A1 | 5/2014 |

(Continued)

OTHER PUBLICATIONS

Extended European Search Report dated Jun. 19, 2018 regarding corresponding European application No. 15865235.1 based on PCT/JP2015083854.

(Continued)

*Primary Examiner* — Tung X Le
*Assistant Examiner* — Henry Luong

(57) ABSTRACT

A first photosensor is sensitive to the wavelength of excitation light, insensitive to the wavelength of fluorescent light, and receives a portion of the output light to generate a first current corresponding to the amount of light received. A second photosensor is sensitive to the fluorescent light wavelength, insensitive to excitation light wavelength, and receives a portion of the output light to generate a second current corresponding to the received light amount. A first current/voltage conversion circuit outputs a first detection voltage corresponding to the voltage drop across a first resistor. A second current/voltage conversion circuit outputs a second detection voltage corresponding to the voltage drop across a second resistor. If (i) a relation between the magnitudes of the first detection voltage and the second detection voltage has reversed, or (ii) if the first detection voltage deviates from a normal voltage range, a judgment unit asserts an abnormality detection signal.

8 Claims, 16 Drawing Sheets

(51) Int. Cl.
  *F21S 41/32* (2018.01)
  *F21V 23/00* (2015.01)
  *G01J 1/02* (2006.01)
  *G01J 1/42* (2006.01)
  *H01S 5/068* (2006.01)
  *F21S 41/16* (2018.01)
  *F21Y 115/30* (2016.01)
  *H01S 5/00* (2006.01)
  *H01S 5/022* (2006.01)

(52) U.S. Cl.
  CPC ............... *F21S 41/16* (2018.01); *F21S 41/32* (2018.01); *F21V 23/003* (2013.01); *G01J 1/0238* (2013.01); *G01J 1/4228* (2013.01); *H01L 31/02* (2013.01); *H01L 31/10* (2013.01); *H01S 5/06825* (2013.01); *F21Y 2115/30* (2016.08); *H01S 5/005* (2013.01); *H01S 5/02296* (2013.01)

(56) References Cited

FOREIGN PATENT DOCUMENTS

| | | |
|---|---|---|
| JP | S62-112161 U | 7/1987 |
| JP | S63-198890 A | 8/1988 |
| JP | 2004-241142 A | 8/2004 |
| JP | 2007-175429 A | 7/2007 |
| JP | 2013-168585 A | 8/2013 |
| WO | 2010/070720 A1 | 6/2010 |

OTHER PUBLICATIONS

International Search Report from International Application No. PCT/JP2015/083854, dated Mar. 8, 2016.

International Preliminary Report on Patentability from International Application No. PCT/JP2015/083854, dated Mar. 8, 2016 (in Japanese); English translation issued on Jun. 6, 2017.

\* cited by examiner

VEHICULAR LIGHTING DEVICE

BACKGROUND OF THE INVENTION

1. Field of the Invention

The present invention relates to vehicular lighting devices employed in automobiles or the like.

2. Description of the Related Art

Halogen lamps and high intensity discharge (HID) lamps have been mainstream as vehicle lighting devices, particularly, headlamp light sources, to date, but in recent years, the development of vehicle lighting devices employing semiconductor light sources such as light-emitting diodes (LEDs) as an alternative to these devices has been advancing. For the sake of further improvement in visibility, vehicle lighting devices furnished with laser diodes (also referred to as "semiconductor lasers") and phosphors instead of LEDs have been disclosed (reference is made to Patent Document 1, for example). With the technology described in Patent Document 1, ultraviolet light that is excitation light output from a laser diode is shone onto a phosphor. Receiving the ultraviolet light, the phosphor generates white light. The white light generated by the phosphor is beamed frontward of the lighting device, whereby a predetermined light distribution pattern is formed. With the technology described in Patent Document 1, the excitation light is beamed.

RELATED ART DOCUMENTS

Patent Documents

Patent Document 1
Japanese Patent Application Laid Open No. 2004-241142
Patent Document 2
International Publication WO 10/070720 pamphlet (1) FIG. 1 is a cross-sectional view of a vehicular lighting-device light source investigated by the present inventors. The light source 10 principally includes a laser diode 12, a phosphor 14, an optical system 16, and a housing 18. In terms of being provided with the laser diode 12 and the phosphor 14, the light source 10 shares points in common with the technology in Patent Document 1.

The laser diode 12 shown in FIG. 1 generates blue excitation light 20 instead of ultraviolet light. The excitation light 20 is focused on the phosphor 14 by means of the optical system 16. The optical system 16 is configured as a lens, reflecting mirror, optical fiber, or a combination thereof. Upon reception of the blue excitation light 20, the phosphor 14 generates fluorescent light 22 having a spectral distribution over a wavelength region including wavelengths (green to red) that are longer than the excitation light 20. The excitation light 20 shone onto the phosphor 14 is scattered by the phosphor 14, and passes through the phosphor 14 in a state in which its coherence has been compromised. The phosphor 14 is set into and supported by an opening formed in the housing 18, for example.

FIG. 2 is a diagram showing the spectrum of output light 24 from the light source 10. The output light 24 of the light source 10 includes blue excitation light 20a having passed through the phosphor 14, and green to red fluorescent light 22 that the phosphor 14 emits, wherein the output light 24 has a white light spectral distribution.

That is, whereas with the light source disclosed in Patent Document 1, the excitation light that is ultraviolet light is not used as a part of the output light for illumination frontward of a vehicle, with the light source 10 shown in FIG. 1, the blue excitation light is used as a part of the output light from the headlight.

As a result of investigations into the light source 10 of FIG. 1, the present inventors came to recognize the following problem. With the light source 10 shown in FIG. 1, if an abnormality has occurred, e.g., if there is a crack in the phosphor 14 or if the phosphor 14 has fallen away from the housing 18, the excitation light 20 generated by the laser diode 12 is directly output with strong coherence without being scattered by the phosphor 14. That is to say, such excitation light 20 having strong coherence is directly emitted forward of the vehicle, which is dangerous.

The present invention has been made in view of such a situation. Accordingly, it is an exemplary purpose of an embodiment of the present invention to provide a technique for detecting the occurrence of an abnormality in a sure manner in a light source configured as a combination of a blue laser diode and a phosphor.

(2) FIG. 4 is a cross-sectional diagram showing a schematic configuration of a vehicle lighting device 100r. The output light of a semiconductor light source 102 is reflected by a reflector 104, and emitted forward of the vehicle via a lens 106. A heat sink 108 is mounted on the light source 102. A cooling fan 110 air-cools the heat sink 108. A lighting circuit 120 supplies a driving current that corresponds to the target light amount to the light source 102 so as to turn on the light source 102.

In some cases, such a vehicle lighting device 100r is provided with a photosensor 122 such as a photodiode or the like in order to detect an abnormality that can occur in the light source 102 or otherwise in order to provide a feedback control operation for controlling the light amount. With such an arrangement, the lighting circuit 120 is preferably arranged in the vicinity of the semiconductor light source 102. On the other hand, such a photosensor 122 is required to be arranged at a position that allows it to receive direct light, reflected light, or scattered light from the light source 102. Accordingly, in many cases, such an arrangement involves a large distance between the photosensor 122 and the lighting circuit 120. Thus, such an arrangement requires the photosensor 122 and the lighting circuit 120 to be coupled via a long wire 124.

With such an arrangement, the photosensor 122 configured as a photodiode or the like outputs a small output current on the order of $\mu A$. Accordingly, in a case in which such a small output current is transmitted via the wire 124, such an arrangement leads to a problem of degraded detection precision due to the effects of noise.

SUMMARY OF THE INVENTION

The present invention has been made in order to solve such a problem. Accordingly, it is an exemplary purpose of an embodiment of the present invention to provide a vehicle lighting device employing a photosensor with improved noise resistance in a signal processing operation.

(1) An embodiment of the present invention relates to an abnormality detector for a light source. The light source comprises: a laser diode structured to emit an excitation light; and a phosphor structured to be excited by the excitation light, and to emit a fluorescent light. The light source is structured to generate a while output light having a spectrum including the excitation light and the fluorescent light. The abnormality detector comprises: a first photosensor structured to be sensitive to a first wavelength and to be substantially insensitive to a second wavelength, and to receive a part of the output light so as to generate a first current that corresponds to an amount of received light; a second photosensor structured to be sensitive to the second wavelength, to be substantially insensitive to the first wavelength, and to receive a part of the output light so as to generate a second current that corresponds to an amount of received light; a first current/voltage conversion circuit comprising a first resistor arranged on a path of the first current, and structured to output a first detection voltage that corresponds to a voltage drop across the first resistor; and a second current/voltage conversion circuit comprising a second resistor arranged on a path of the second current, and structured to output a second detection voltage that corresponds to a voltage drop across the second resistor; and a judgment unit structured to assert an abnormality detection signal (i) when a magnitude relation has reversed between the first detection voltage and the second detection voltage, or otherwise (ii) when the first detection voltage deviates from a voltage range in which the first detection voltage is to be detected in a normal state.

The first detection voltage changes linearly according to the amount of excitation light with a slope that corresponds to the resistance value of the first resistor. Similarly, the second detection voltage changes linearly according to the amount of fluorescent light with a slope that corresponds to the resistance value of the second resistor. When the phosphor operates normally, there is a proportional relation between the intensity of the excitation light, the intensity of the fluorescent light, and the intensity of the white light which is the output of the light source. Accordingly, when the phosphor operates normally, the ratio between the first detection voltage and the second detection voltage is maintained at a substantially constant level. In contrast, when the excitation light is directly emitted due to an abnormality that has occurred in the phosphor, deviation occurs in the relation between the excitation light and the fluorescent light included in the output light. This leads to a change in the ratio between the first detection voltage and the second detection voltage. With such an embodiment, by appropriately designing the resistance values of the first resistor and the second resistor, and by monitoring the first detection voltage and the second detection voltage, such an arrangement is capable of detecting an abnormality in the phosphor in a sure manner and in a simple manner regardless of the intensity of the white light, i.e., regardless of the output of the light source.

Furthermore, if an abnormality such as an open-circuit fault, a short-circuit fault, or the like, has occurred in the components of the first photosensor or the first current/voltage conversion circuit, or otherwise in a line that couples such components, the output of the amplifier that forms the first current/voltage conversion circuit is fixedly set to the power supply voltage or otherwise the ground voltage (output saturation). In this case, the first detection voltage deviates from a voltage range in which the first detection voltage is to be detected in the normal state. Thus, such an embodiment is capable of detecting an abnormality and a malfunction in the abnormality detector itself.

Also, (iii) when the second detection voltage deviates from a voltage range in which the second detection voltage is to be detected in the normal state, the judgment unit may assert the abnormality detection signal.

If an abnormality such as an open-circuit fault, a short-circuit fault, or the like, has occurred in the components of the second photosensor or the second current/voltage conversion circuit, or otherwise in a line that couples such components, the output of the amplifier that forms the second current/voltage conversion circuit is fixedly set to the power supply voltage or otherwise the ground voltage (output saturation). In this case, the second detection voltage deviates from a voltage range in which the second detection voltage is to be detected in the normal state. Thus, such an embodiment is capable of detecting an abnormality and a malfunction in the abnormality detector itself.

In a case in which the first current has a current value I1 and the second current has a current value I2 when the phosphor operates normally, and in a case in which the first current has a current value I1' and the second current has a current value I2' when there is an abnormality in the phosphor, the resistance value R1 of the first resistor and the resistance value R2 of the second resistor may be designed so as to satisfy the following Expressions.

$$R1 \times I1 < R2 \times I2 \qquad (1)$$

$$R1 \times I1' > R2 \times I2' \qquad (2)$$

In this case, such an arrangement is capable of detecting an abnormality based on the result of the comparison of the magnitude relation between the first detection voltage and the second detection voltage.

Also, a boundary of the voltage range may be generated by dividing a power supply voltage supplied to the abnormality detector.

In a case in which deviation occurs in the power supply voltage $V_{CC}$, this leads to a change in the saturation level of the output of the amplifier. In order to solve such a problem, the boundaries of the voltage range (i.e., the threshold values) are generated based on a voltage obtained by dividing the power supply voltage $V_{CC}$. Such an arrangement allows the threshold values to be adjusted according to a change in the power supply voltage $V_{CC}$.

Also, the judgment unit may be structured to offset at least one from among the first detection voltage and the second detection voltage so as to increase a difference between them, and to monitor a magnitude relation between the first and second detection voltages thus offset.

When the output of the light source is small, there is a small difference between the first detection voltage and the second detection voltage. In some cases, this leads to false detection of an abnormality due to noise effects. By providing the offset, such an arrangement suppresses the false detection of an abnormality when the light amount is small.

Also, the first current/voltage conversion circuit may comprise: a first operational amplifier arranged such that its inverting input terminal is coupled to the first photosensor, and a fixed voltage is applied to its non-inverting input terminal; and a first resistor arranged between the inverting input terminal and the output terminal of the first operational amplifier. Also, the second current/voltage conversion circuit may comprise: a second operational amplifier arranged such that its inverting input terminal is coupled to the second photosensor, and a fixed voltage is applied to its non-inverting input terminal; and a second resistor arranged between the inverting input terminal and the output terminal of the second operational amplifier.

With such an arrangement, the gain (current/voltage conversion gain) of the first current/voltage conversion circuit is determined by only the resistance value of the first resistor. Furthermore, the gain of the second current/voltage conversion circuit is determined by only the resistance value of the second resistor. Such an arrangement allows the error factors to be reduced, thereby providing high-precision abnormality detection.

The first photosensor and the second photosensor may comprise a first photodiode and a second photodiode, respectively. The first photodiode may be arranged such that its cathode is coupled to the inverting input terminal of the first operational amplifier, and such that a fixed voltage is applied to its anode. The second photodiode may be arranged such that its cathode is coupled to the inverting input terminal of the second operational amplifier, and such that a fixed voltage is applied to its anode.

With such an arrangement, no voltage is applied across the anode and the cathode of each photodiode. Thus, such an arrangement is capable of detecting light over a wide light amount range without the adverse effects of dark current.

The first photosensor and the second photosensor may comprise a first photodiode and a second photodiode, respectively. The first operational amplifier may be arranged such that its inverting input terminal is coupled to the anode of the anode of the first photodiode, such that its non-inverting input terminal is coupled to the cathode of the first photodiode, and such that a predetermined fixed voltage is applied to its non-inverting input terminal. The second operational amplifier may be arranged such that its inverting input terminal is coupled to the anode of the second photodiode, such that its non-inverting input terminal is coupled to the cathode of the second photodiode, and such that a fixed voltage is applied to its non-inverting input terminal.

The judgment unit may comprise a voltage dividing circuit structured to divide the second detection voltage. Such an arrangement requires only a simple configuration including only a pair of resistors to provide the offset. It should be noted that, when the output of the light source is larger than a predetermined value, the effect of such a voltage dividing circuit thus provided, i.e., the effect of the offset thus provided, is small. Thus, even in such a situation, such an arrangement allows the precision of the abnormality detection to be maintained.

Also, the first current/voltage conversion circuit and the second current/voltage conversion circuit may each be configured as an inverting converter.

Also, the first photosensor may comprise first photodiode. Also, the second photosensor may comprise a second photodiode. Also, the first photodiode and the second photodiode may be configured in the form of a single photodiode module. Also, the photodiode module may comprise: the first photodiode and the second photodiode arranged such that cathodes thereof are coupled so as to form a common cathode; a first anode terminal coupled to an anode of the first photodiode; a second anode terminal coupled to an anode of the second photodiode; a cathode terminal coupled to the common cathode; and a metal casing structured to be electrically insulated from the cathode terminal shared by the cathodes, the first anode terminal, and the second anode terminal. Also, the photodiode module may be housed in a CAN package.

In this case, even if the metal casing of the CAN package is short-circuited to the ground line or otherwise to the power supply line, such an arrangement has no effect on the operation of the photodiodes configured as internal components of the package. Thus, such an arrangement provides improved reliability. Furthermore, the metal casing functions as a shield, thereby providing further improved noise resistance.

The abnormality detection signal may be switched between a negated level configured as an intermediate level between the power supply voltage and the ground voltage and an asserted level configured as either the power supply voltage or otherwise the ground voltage.

In the signal design for the abnormality detection signal, the asserted level that indicates an abnormality is assigned to a voltage level that cannot occur when an abnormality such as an open-circuit fault, a short-circuit fault, or the like has occurred in the signal line. Furthermore, the negated level that indicates the normal state is assigned to a voltage level that can occur when such an abnormality has occurred. Such an arrangement is capable of executing a suitable protection operation even when a short-circuit fault or an open-circuit fault has occurred in the line via which the abnormality detection signal is to be transmitted, in addition to when the abnormality detection signal indicates an abnormality.

Another embodiment of the present invention relates to a vehicular lighting device. The vehicular lighting device comprises: a light source; and any one of the aforementioned abnormality detectors, structured to detect an abnormality in the light source.

Yet another embodiment of the present invention relates to a photodiode module. The photodiode module comprises: a first photodiode and a second photodiode arranged such that cathodes thereof are coupled so as to form a common cathode; a first anode terminal coupled to an anode of the first photodiode; a second anode terminal coupled to an anode of the second photodiode; a cathode terminal coupled to the common cathode; and a metal casing structured to be electrically insulated from the first anode terminal, the second anode terminal, and the cathode terminal. The photodiode module is housed in a CAN package.

With such an embodiment, in a case in which the cathode of the photodiode module is coupled to the power supply, such an arrangement is capable of protecting the circuit from becoming inoperative even if the metal casing is short-circuited to the ground line. In addition, the metal casing functions as a shield, thereby providing improved noise resistance.

Also, the photodiode module may further comprise a casing terminal coupled to the metal casing.

With such an arrangement, by grounding the casing terminal, the electric potential of the metal casing can be set to a fixed value, thereby providing the metal casing with further improved performance as a shield.

(3) Yet another embodiment of the present invention relates to a vehicular lighting device. The vehicular lighting device comprises: a light source; a photosensor structured to receive light from the light source; a preamplifier structured to amplify an output of the photosensor, so as to generate a detection signal that indicates an amount of received light; and a lighting circuit structured to drive the light source based on at least the output of the preamplifier. The photosensor and the preamplifier are mounted on a single sub-base member that is separate from a base member on which the lighting circuit is mounted. The sub-base member and the lighting circuit are coupled via a signal line via which a signal that corresponds to the output of the preamplifier is transmitted, and via a power supply line via which a power supply voltage is supplied from the lighting circuit to the sub-base member.

With such an arrangement, the photosensor and the preamplifier are arranged on the same base member such that they are in the vicinity of each other. Accordingly, the amplified detection signal or otherwise a signal that corresponds to the detection signal can be transmitted to the lighting circuit via wiring. That is to say, the signal to be transmitted via the line has a large amplitude. Such an arrangement provides improved noise resistance, thereby providing improved precision of the abnormality detection.

Also, the photosensor may be used to detect an abnormality in the light source. Also, the vehicular lighting device may further comprise a judgment unit mounted on the sub-base member, and structured to generate an abnormality detection signal that indicates the presence or absence of an abnormality in the light source based on the detection signal.

In this case, the digital signal that can switch between two states so as to indicate the presence or absence of an abnormality is transmitted to the lighting circuit via wiring. Thus, such an arrangement provides further improved noise resistance as compared with an arrangement in which the abnormality detection signal is transmitted in the form of an analog signal.

When the abnormality detection signal indicates a normal state, the abnormality detection signal may be set to an electric potential level determined between a power supply voltage and a ground voltage. When the abnormality detection signal indicates an abnormal normal state, the abnormality detection signal may be set to the power supply voltage or otherwise the ground voltage.

With such an arrangement, even if the line via which the abnormality detection signal is to be transmitted is short-circuited to the ground line or the power supply line, the lighting circuit is capable of recognizing such a situation as an abnormality. Thus, such an arrangement provides improved reliability.

Also, the vehicular lighting device according to an embodiment may further comprise a reflector structured to reflect light emitted from the light source. Also, the photosensor may be arranged to receive light after it passes through a slit or otherwise a pinhole formed in the reflector.

Yet another embodiment of the present invention also relates to a vehicular lighting device. The vehicular lighting device comprises: a light source that comprises a laser diode structured to emit an excitation light and a phosphor structured to be excited by the excitation light and to emit a fluorescent light, and that is structured to generate a while output light having a spectrum including the excitation light and the fluorescent light; a lighting circuit structured to drive the light source; a first photosensor structured to be sensitive to a wavelength of the excitation light and to be substantially insensitive to a wavelength of the fluorescent light, and to receive a part of the output light so as to generate a first current that corresponds to an amount of received light; a second photosensor structured to be sensitive to the wavelength of the fluorescent light, to be substantially insensitive to the wavelength of the excitation light, and to receive a part of the output light so as to generate a second current that corresponds to an amount of received light; a first preamplifier comprising a first operational amplifier and a first resistor arranged on a path of the first current, and structured to output a first detection signal that corresponds to a voltage drop across the first resistor; a second preamplifier comprising a second operational amplifier and a second resistor arranged on a path of the second current, and structured to output a second detection signal that corresponds to a voltage drop across the second resistor; and a judgement unit structured to judge the presence or absence of an abnormality in the light source based on the first detection signal and the second detection signal. The first photosensor, the second photosensor, the first preamplifier, and the second preamplifier are mounted on a single sub-base member that is separate from a base member on which the lighting circuit is mounted.

Also, the judgment unit may be mounted on the sub-base member.

In this case, the digital signal configured as a binary signal that indicates the presence or absence of an abnormality is transmitted to the lighting circuit via wiring. Thus, such an arrangement provides further improved noise resistance as compared with an arrangement in which the abnormality detection signal is transmitted in the form of an analog signal.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
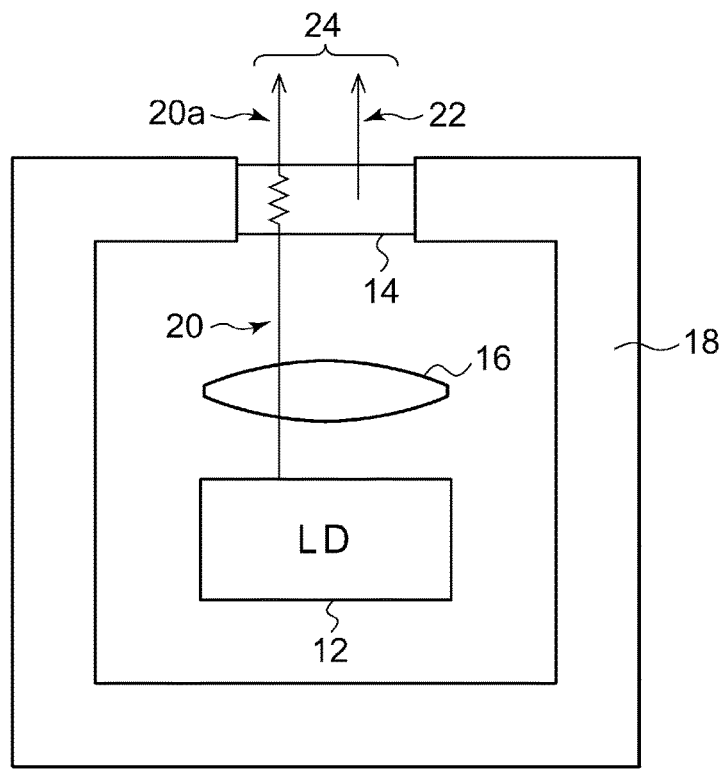
FIG. 1 is a cross-sectional view of a light source of a vehicular lighting device investigated by the present inventor.
Figure 2:
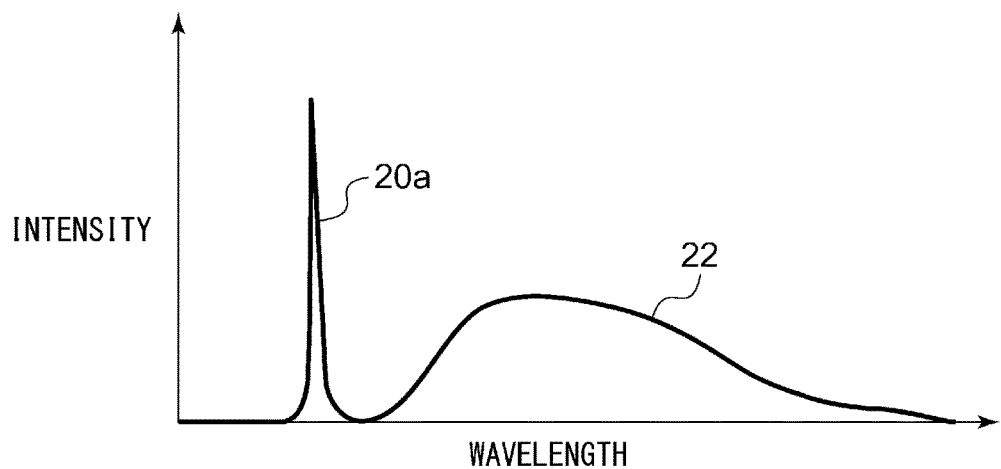
FIG. 2 is a diagram showing a spectrum of the output light of the light source.

Description will be made below regarding preferred embodiments according to the present invention with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

In the present specification, the state represented by the phrase "the member A is coupled to the member B" includes a state in which the member A is indirectly coupled to the member B via another member that does not substantially affect the electric connection therebetween, or that does not damage the functions or effects of the connection therebetween, in addition to a state in which the member A is physically and directly coupled to the member B.

Similarly, the state represented by the phrase "the member C is provided between the member A and the member B" includes a state in which the member A is indirectly coupled to the member C, or the member B is indirectly coupled to the member C via another member that does not substantially affect the electric connection therebetween, or that does not damage the functions or effects of the connection therebetween, in addition to a state in which the member A is directly coupled to the member C, or the member B is directly coupled to the member C.

In the present specification, the reference symbols denoting electric signals such as a voltage signal, current signal, or the like, and the reference symbols denoting circuit elements such as a resistor, capacitor, or the like, also represent the corresponding voltage value, current value, resistance value, or capacitance value as necessary.

First Embodiment

Figure 4:
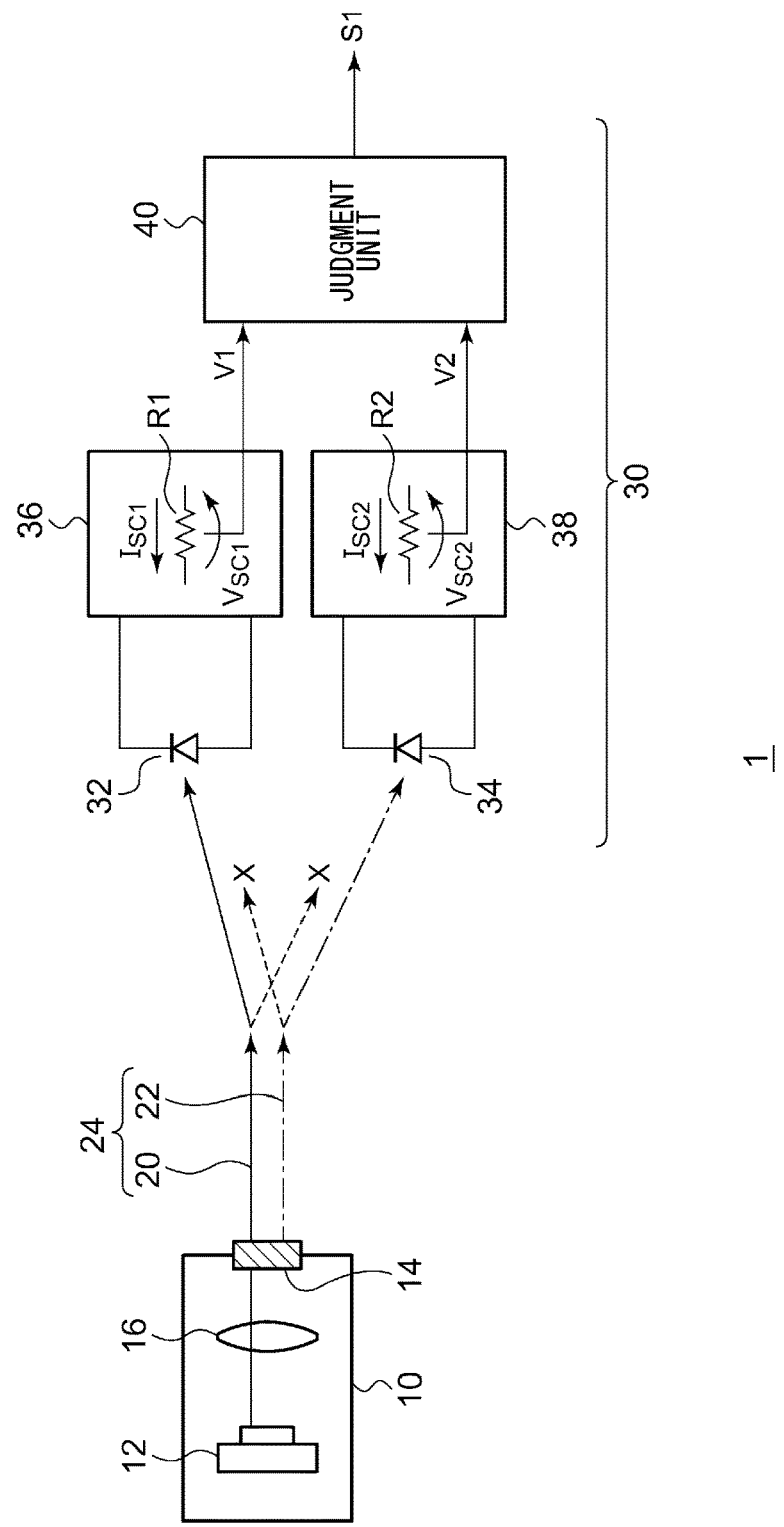
FIG. 4 is a block diagram showing a vehicular lighting device including an abnormality detector according to a first embodiment.

FIG. 4 is a block diagram showing a vehicle lighting device 1 including an abnormality detector 30 according to a first embodiment. The vehicle lighting device 1 includes a light source 10 and the abnormality detector 30 configured to detect an abnormality that can occur in the light source 10.

As described above with reference to FIG. 1, the light source 10 includes a laser diode 12, a phosphor 14, and an optical system 16. The laser diode 12 emits excitation light 20. The laser diode 12 emits light with an intensity that corresponds to a driving current received from an unshown driving circuit. The phosphor 14 is arranged on an optical path for the excitation light 20. The phosphor 14 is excited by the excitation light 20, and emits fluorescent light 22. The light source 10 is configured to generate white output light 24 having a spectrum including the excitation light 20 and the fluorescent light 22.

The abnormality detector 30 receives a part of the output light 24, so as to judge the presence or absence of an abnormality that can occur in the light source 10, and more specifically, to judge the presence or absence of an abnormality that can occur in the phosphor 14. Examples of such an abnormality that can occur in the phosphor 14 include cracking, dislocation, aging degradation, and the like. However, the abnormality is not particularly restricted in kind.

The abnormality detector 30 includes a first photosensor 32, a second photosensor 34, a first preamplifier (which will also be referred to as a "first current/voltage conversion circuit") 36, a second preamplifier (which will also be referred to as a "second current/voltage conversion circuit") 38, and a judgment unit 40. The first photosensor 32 is configured to be sensitive to the wavelength of the excitation light 20, and to be substantially insensitive to the wavelength of the fluorescent light 22. The first photosensor 32 receives a part of the output light 24, and generates a first current $I_{SC1}$ that corresponds to the intensity of the excitation light 20 after it passes through the phosphor 14. In contrast, the second photosensor 34 is configured to be sensitive to the wavelength of the fluorescent light 22, and to be insensitive to the wavelength of the excitation light 20. The second photosensor 34 receives a part of the output light 24, and generates a second current $I_{SC2}$ that corresponds to the intensity of the fluorescent light 22 emitted from the phosphor 14.

In order to provide a suitable wavelength-dependent sensitivity, i.e., a suitable wavelength selectivity, the first photosensor 32 and the second photosensor 34 may each be configured employing a color filter. Also, in order to provide such a function, the semiconductor material or the device structure may be designed for each sensor. Also, the first photosensor 32 and the second photosensor 34 are not particularly restricted in kind. Specifically, the first photosensor 32 and the second photosensor 34 may each be configured as a semiconductor photosensor such as a photodiode, a phototransistor, or the like. Description will be made in the present embodiment assuming that the first photosensor 32 and the second photosensor 34 each include a photodiode.

The first current/voltage conversion circuit 36 includes a first resistor R1 arranged on a path of the first current $I_{SC1}$, and outputs a first detection voltage V1 that corresponds to a voltage drop $V_{SC1}$ across the first resistor R1. The first detection voltage V1 changes linearly according to the first current $I_{SC1}$ with a slope that corresponds to the resistance value of the first resistor R1.

The second current/voltage conversion circuit 38 includes a second resistor R2 arranged on a path of the second current $I_{SC2}$, and outputs a second detection voltage V2 that corresponds to a voltage drop $V_{SC2}$ across the second resistor R2. The second detection voltage V2 changes linearly according to the second current $I_{SC2}$ with a slope that corresponds to the resistance value of the second resistor R2.

The judgement unit 40 judges the presence or absence of an abnormality based on the first detection voltage V1 and the second detection voltage V2. Upon detection of an abnormality, the judgment unit 40 asserts (sets to the high level, for example) an abnormality detection signal S1.

Specifically, (i) when the magnitude relation between the first detection voltage V1 and the second detection voltage V2 has reversed from that in the normal state, (ii) when the first detection voltage V1 deviates from a voltage range in which the first detection voltage V1 is to be detected in a normal state, or (iii) when the second detection voltage V2 deviates from a voltage range in which the second detection voltage V2 is to be detected in the normal state, the judgment unit 40 asserts the abnormality detection signal S1.

The above is the basic configuration of the abnormality detector 30. Next, description will be made regarding the operation mechanism thereof.

The first detection voltage V1 changes linearly according to the light amount of the excitation light 20 with a slope determined according to the resistance value of the first resistor R1. Similarly, the second detection voltage V2 changes linearly according to the light amount of the fluorescent light 22 with a slope determined according to the resistance value of the second resistor R2. With such an arrangement, when the phosphor 14 operates normally, there is a proportional relation between the intensity of the excitation light 20, the intensity of the fluorescent light 22, and the intensity of the output light 24 emitted from the light source 10. Accordingly, when the phosphor 14 operates normally, the ratio between the first detection voltage V1 and the second detection voltage V2 exhibits a substantially constant value. In contrast, when the excitation light 20 is directly emitted due to the occurrence of an abnormality in the phosphor 14, the intensity ratio between the excitation light 20 and the fluorescent light 22 included in the output light 24 deviates from that in the normal state, leading to a change in the ratio between the first detection voltage V1 and the second detection voltage V2. With the abnormality detector 30 shown in FIG. 4, by appropriately designing the resistance values of the first resistor R1 and the second resistor R2, and by monitoring the first detection voltage V1 and the second detection voltage V2, such an arrangement is capable of detecting, in a simple and sure manner, an abnormality that can occur in the phosphor 14 regardless of the intensity of the white light, i.e., regardless of the output level of the light source.

Figure 5A:
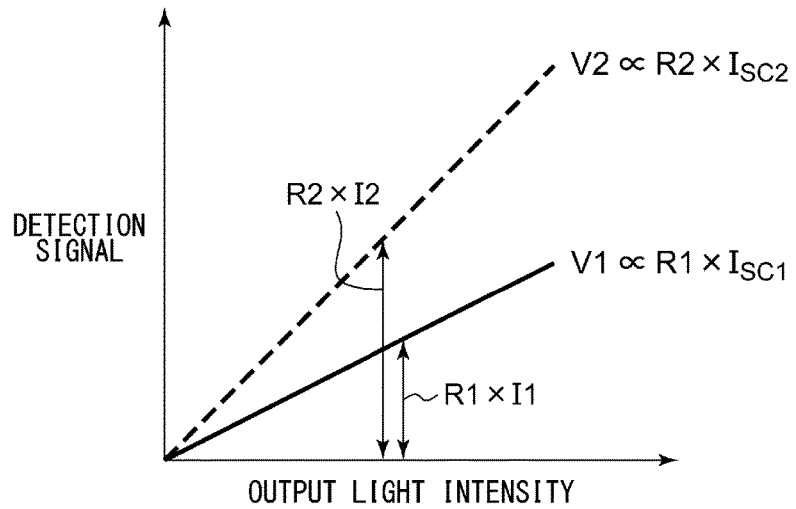
FIG. 5A is a diagram showing the relation between the intensity of the output light, the first detection voltage, and the second detection voltage when a phosphor operates normally.
Figure 5B:
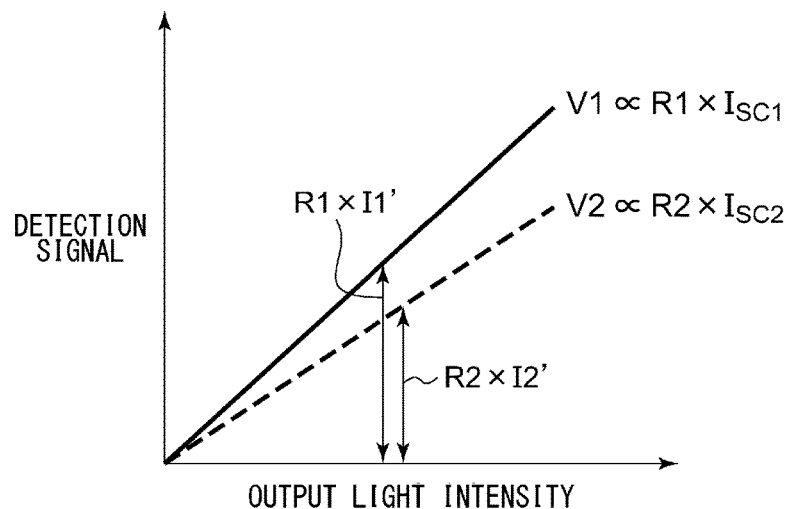
FIG. 5B is a diagram showing the relation between the intensity of the output light, the first detection voltage, and the second detection voltage when there is an abnormality in the phosphor.

FIG. 5A is a diagram showing the relation between the output light intensity, the first detection voltage V1, and the second detection voltage V2, when the phosphor 14 operates normally. FIG. 5B is a diagram showing the relation between the output light intensity, the first detection voltage V1, and the second detection voltage V2, when there is an abnormality in the phosphor 14.

Description will be made below assuming that, when the output light has a given intensity, and when the phosphor 14 operates normally, the first current $I_{SC1}$ has a current value of I1, and the second current $I_{SC2}$ has a current value of I2, and assuming that, when there is abnormality in the phosphor 14, the first current $I_{SC1}$ has a current value of I1', and the second current $I_{SC2}$ has a current value of I2'. When an abnormality has occurred in the phosphor 14, the intensity of the fluorescent light 22 falls, and the excitation light 20 passes through without being converted into the fluorescent light 22. Thus, the relations I1'>I1 and I2'<I2 hold true. With such an arrangement, the resistance values of the first resistor R1 and the second resistor R2 are preferably designed so as to satisfy the following relation expressions.

$$R1 \times I1 < R2 \times I2 \quad (1)$$

$$R1 \times I1' > R2 \times I2' \quad (2)$$

The abnormality detector 30 monitors the magnitude relation between the first detection voltage V1 and the second detection voltage V2. When the magnitude relation thus monitored has reversed from the relation in a normal state, the abnormality detector 30 judges that there is an abnormality. The operation of the abnormality detector 30 is equivalent to comparison between: the ratio between the detection current $I_{SC1}$ generated by the first photosensor 32 and the detection current $I_{SC2}$ generated by the second photosensor 34, which is represented by $I_{SC1}/I_{SC2}$; and the resistance ratio between the first resistor R1 and the second resistor R2, i.e., R2/R1. When the ratio between the intensity of the blue excitation light 20 and the intensity of the yellow fluorescent light, which is represented by $I_{SC1}/I_{SC2}$, exceeds a predetermined threshold value (R2/R1), the abnormality detector 30 is capable of judging that there is an abnormality.

When an abnormality such as an open-circuit fault or a short-circuit fault has occurred in a component such as the first photosensor 32 or the first current/voltage conversion circuit 36 or in a line that couples such components, the output of an amplifier (not shown), which is a component of the first current/voltage conversion circuit 36, is fixedly set to the power supply voltage $V_{CC}$ or otherwise to the ground voltage $V_{GND}$ (output saturation). In this state, the first detection voltage V1 is fixedly set to the power supply voltage $V_{CC}$ or otherwise to the ground voltage $V_{GND}$. That is to say, the first detection voltage V1 deviates from the voltage range in which it is to be detected in a normal state. Thus, with the abnormality detector 30 shown in FIG. 4, such an arrangement is capable of detecting an abnormality and a malfunction that can occur in the abnormality detector 30 itself.

Similarly, when an abnormality such as an open-circuit fault or a short-circuit fault has occurred in a component such as the second photosensor 34 or the second current/voltage conversion circuit 38 or in a line that couples such components, the output of an amplifier (not shown), which is a component of the second current/voltage conversion circuit 38, is fixedly set to the power supply voltage $V_{CC}$ or otherwise to the ground voltage $V_{GND}$. In this state, the second detection voltage V2 deviates from the voltage range in which it is to be detected in a normal state. Thus, with the abnormality detector 30 shown in FIG. 4, such an arrangement is capable of detecting an abnormality and a malfunction that can occur in the abnormality detector 30 itself.

The present invention encompasses various kinds of circuits that can be regarded as a block configuration shown in FIG. 4. Description will be made below regarding specific examples thereof.

Figure 6:
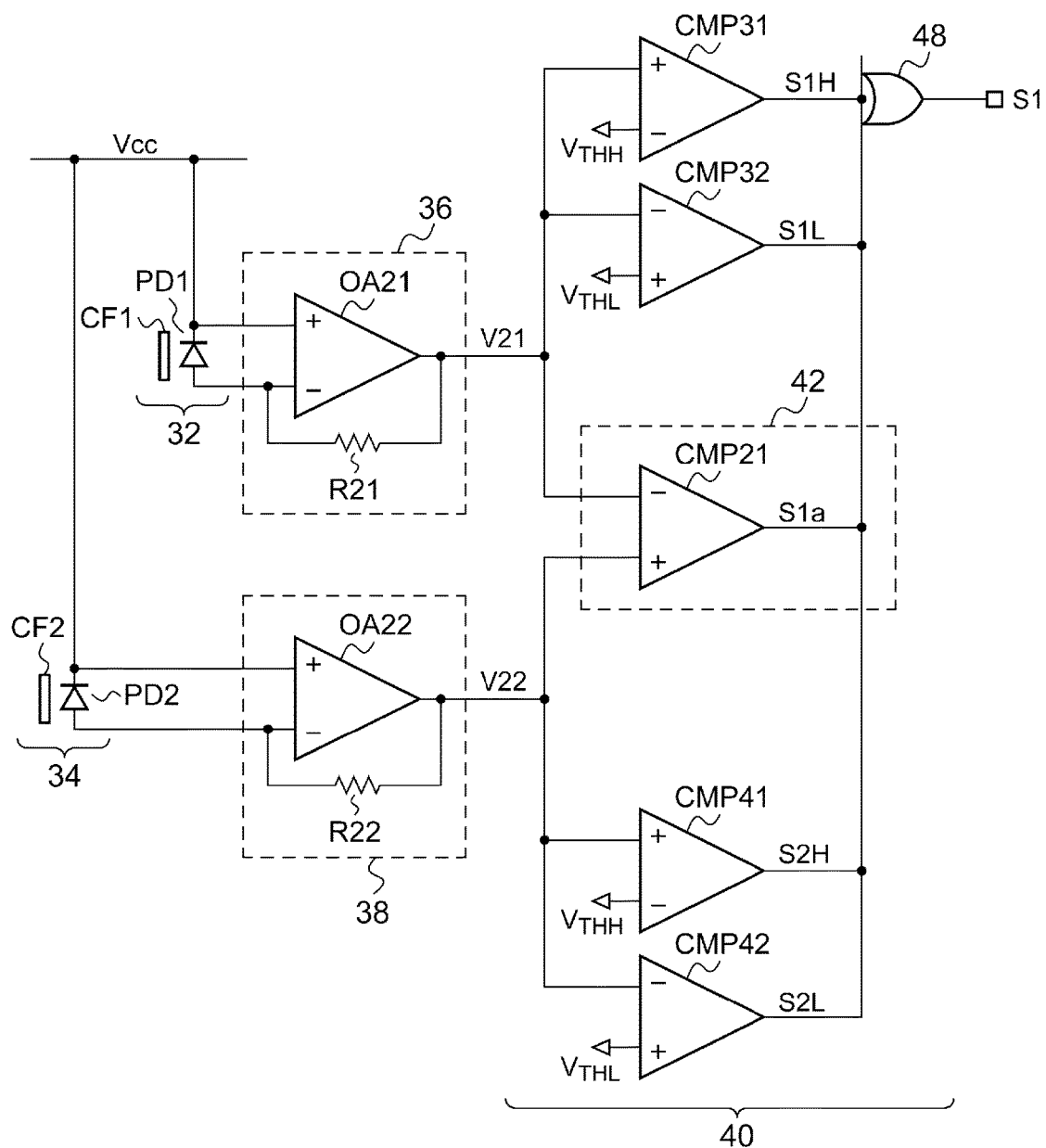
FIG. 6 is a circuit diagram showing an abnormality detector according to a first example configuration.

FIG. 6 is a circuit diagram showing an abnormality detector 30 according to a first example configuration.

With such an example configuration, the first photosensor 32 includes a first photodiode PD1 and a first color filter CF1. The first color filter CF1 is configured to have a high transmittance for blue light that corresponds to the wavelength of the excitation light 20, and to have a low transmittance for the wavelength of the fluorescent light 22. The second photosensor 34 includes a second photodiode PD2 and a second color filter CF2. The second color filter CF2 is configured to have a high transmittance for a wavelength range from green to red that corresponds to the wavelength range of the fluorescent light 22, and to have a low transmittance for blue light. As the first color filter CF1, a blue filter may be employed. As the second color filter CF2, a yellow filter, a green filter, or otherwise a red filter may be employed.

The first current/voltage conversion circuit 36 includes a first operational amplifier OA21 arranged such that its inverting input terminal (−) is coupled to an anode of the first photodiode PD1, its non-inverting input terminal (+) is coupled to a cathode of the first photodiode PD1, and a predetermined fixed voltage is applied to its non-inverting input terminal (+). For example, the fixed voltage may be configured as the power supply voltage $V_{CC}$. Also, the fixed voltage may be set to other voltage levels. Resistors R21 and R22 correspond to the resistors R1 and R2 shown in FIG. 4, respectively.

The voltage level of the first detection voltage V21 generated by the first current/voltage conversion circuit 36 shown in FIG. 6 is represented by the following Expression (3).

$$V21 = V_{CC} - R21 \times I_{SC1} \quad (3)$$

The second current/voltage conversion circuit 38 is configured in the same manner as the first current/voltage conversion circuit 36. The voltage level of the output V22 is represented by the following Expression (4).

$$V22 = V_{CC} - R22 \times I_{SC2} \quad (4)$$

The judgment unit 40 includes voltage comparators CMP21, CMP31, CMP32, CMP41, and CMP42. When V21>V22, i.e., when the phosphor operates normally, the voltage comparator CMP21 sets an abnormality detection signal S1a to the low level (negated). Conversely, when V21<V22, i.e., when there is an abnormality in the phosphor, the voltage comparator CMP21 sets the abnormal detection signal S1a to the high level (asserted).

The current/voltage conversion gain (transimpedance) of the first current/voltage conversion circuit 36 depends on only the first resistor R1, and that of the second current/voltage conversion circuit 38 depends on only the second resistor R2. Such an arrangement allows the effects due to variation in the circuit elements to be reduced, thereby providing high-precision abnormality detection.

A pair of voltage comparators CMP31 and CMP32 judge whether or not the first detection voltage V21 is within a normal voltage range. The voltage comparator CMP31 compares the first detection voltage V21 with an upper-side threshold voltage $V_{THH}$. When V21>$V_{THH}$, the voltage comparator CMP31 asserts (sets to the high level) an abnormality detection signal S1H. Conversely, when V21<$V_{THH}$, the voltage comparator CMP31 negates (sets to the low level) the abnormality detection signal S1H. The voltage comparator CMP32 compares the first detection voltage V21 with a lower-side threshold voltage $V_{THL}$. When V21<$V_{THL}$, the voltage comparator CMP32 asserts (sets to the high level) an abnormality detection signal S1L. Conversely, when V21>$V_{THL}$, the voltage comparator CMP32 negates (sets to the low level) the abnormality detection signal S1L. The threshold voltage $V_{THL}$ may be determined based on the lower limit of the normal voltage range. The threshold voltage $V_{THH}$ may be determined based on the upper limit of the normal voltage range. For example, in a case in which $V_{CC}$=5V, the threshold voltage $V_{THH}$ may be set to a value in the vicinity of 4.4 V, and the threshold voltage $V_{THL}$ may be set to a value in the vicinity of 0.1 V.

In the same way, a pair of voltage comparators CMP41 and CMP42 judge whether or not the second detection voltage V22 is within the normal voltage range. When V22>$V_{THH}$, an abnormality detection signal S2H is asserted. Conversely, when V22<$V_{THL}$, an abnormality detection signal S2L is asserted.

A logic gate 48 performs a logical operation on the outputs of the respective comparators. When at least one of the outputs of the comparators is asserted, the logic gate 48 asserts (sets to the high level, for example) the abnormality detection signal S1 configured as a final output. In the logic system shown in FIG. 6, the logic gate is configured as an OR gate.

The above is the configuration of the abnormality detector 30 according to the first example configuration. Next, description will be made regarding the operation thereof.

Figure 7A:
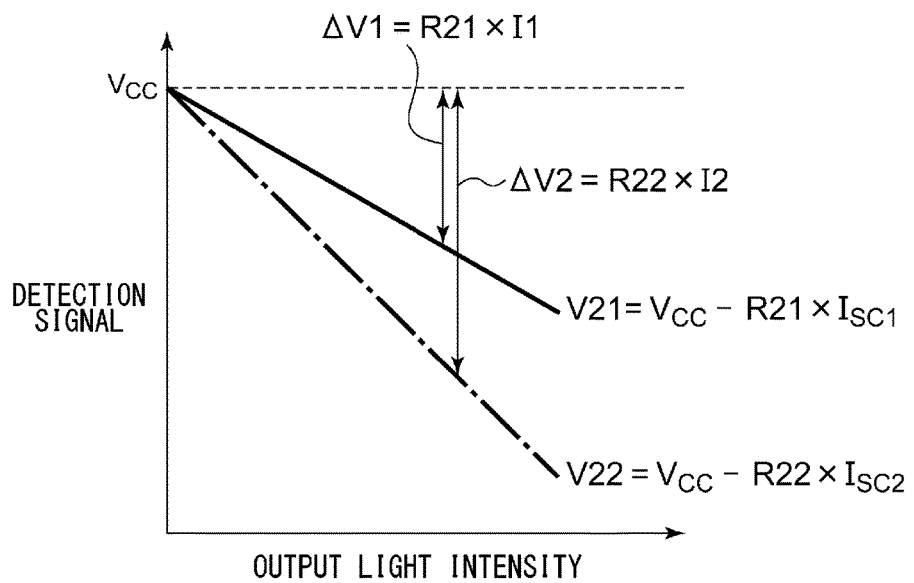
FIG. 7A is a diagram showing the relation between the intensity of the output light, the first detection voltage, and the second detection voltage when a phosphor operates normally.
Figure 7B:
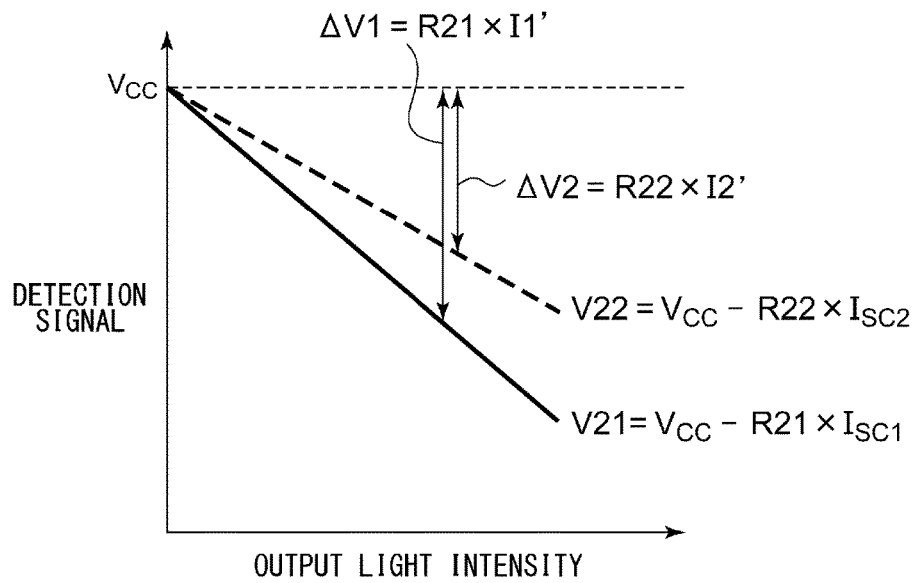
FIG. 7B is a diagram showing the relation between the intensity of the output light, the first detection voltage, and the second detection voltage when there is an abnormality in the phosphor.

FIG. 7A is a diagram showing the relation between the output light intensity, the first detection voltage V21, and the second detection voltage V22, when the phosphor 14 operates normally. FIG. 7B is a diagram showing the relation between the output light intensity, the first detection voltage V21, and the second detection voltage V22, when there is an abnormality in the phosphor 14. As described above, the resistance values of the resistors R21 and R22 are designed such that the relation expressions (1) and (2) hold true. Accordingly, when the phosphor 14 operates normally, the relation V21>V22 holds true. Conversely, when there is an abnormality, the relation V22<V21 holds true. When V21>V22, i.e., when the phosphor 14 operates normally, the voltage comparator CMP21 shown in FIG. 6 sets the abnormality detection signal S1a to the low level (signal negation). Conversely, when V21<V22, i.e., when there is an abnormality, the voltage comparator CMP21 sets the abnormality detection signal S1a to the high level (signal assertion).

Figure 8:
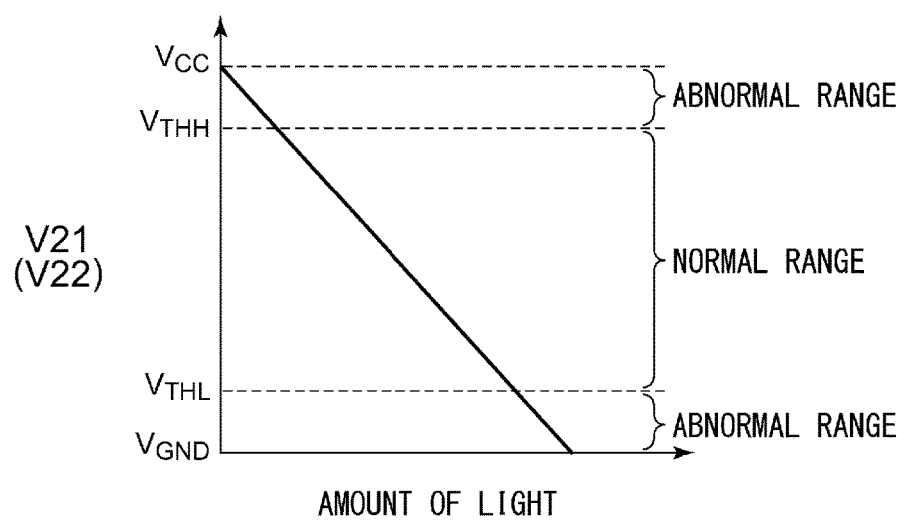
FIG. 8 is a diagram for explaining abnormality judgment based on detection voltage.

FIG. 8 is a diagram for explaining abnormality judgement based on the detection voltage V21 (V22). Description will be made regarding a case in which such abnormality judgment is made based on the detection voltage V21. As shown in FIG. 7A, as the light amount becomes larger, the detection voltage V21 becomes lower.

When a circuit abnormality such as an open-circuit fault, short-circuit fault, or the like has occurred in the first photodiode PD1, the first resistor R21, or the output of the first operational amplifier OA21, the output V21 of the first operational amplifier OA21 is fixedly set to the upper limit or otherwise the lower limit of its output range, i.e., output saturation occurs in the output V21. For example, in a case in which the first operational amplifier OA21 is configured as a Rail-To-Rail operational amplifier that is capable of providing output that is swingable over a full range between the power supply voltage $V_{CC}$ and the ground voltage $V_{GND}$, when output saturation has occurred, the output V21 is fixedly set to a value in the vicinity of $V_{CC}$ or otherwise in the vicinity of $V_{GND}$.

With such an arrangement, the upper-side threshold voltage $V_{THH}$ is set to a value in the vicinity of the power supply voltage $V_{CC}$, and the lower-side threshold voltage $V_{THL}$ is set to a value in the vicinity of the ground voltage $V_{CC}$. By comparing the detection voltage V21 with the threshold voltages $V_{THH}$ and $V_{THL}$ thus set, such an arrangement is capable of detecting an abnormality such as an open-circuit fault, short-circuit fault, and the like.

With the circuit shown in FIG. 6, when V21>$V_{THH}$, it can be assumed that an abnormality such as an open-circuit fault, short-circuit fault, or the like has occurred in a component, or that COD (Catastrophic Optical Damage) has occurred in the laser diode 12. COD represents a malfunction of the laser diode 12 involving drastic degradation of the output light amount without change in the electrical characteristics. Similarly, when V21<$V_{THL}$, it can be assumed that an abnormality such as an open-circuit fault, short-circuit fault, or the like has occurred in a component.

In the same mechanism, by monitoring the second detection voltage V22, such an arrangement is capable of detecting a malfunction such as an open-circuit fault, short-circuit fault, or the like that can occur in the second photodiode PD2, the second operational amplifier OA22, the resistor R21, and the like. Conversely, when V22<$V_{THH}$, it can also be assumed that the light amount of the fluorescent light 22 drastically falls. In this case, examples of suspected causes include the phosphor 14 falling away from the housing, and the like.

As described above, with the abnormality detector 30 according to the embodiment, such an arrangement is capable of detecting an open-circuit fault, a short-circuit fault, COD that can occur in the laser diode 12, the phosphor 14 falling away from the housing, and the like. Thus, such an arrangement allows a suitable fail-handling operation to be performed.

Figure 9:
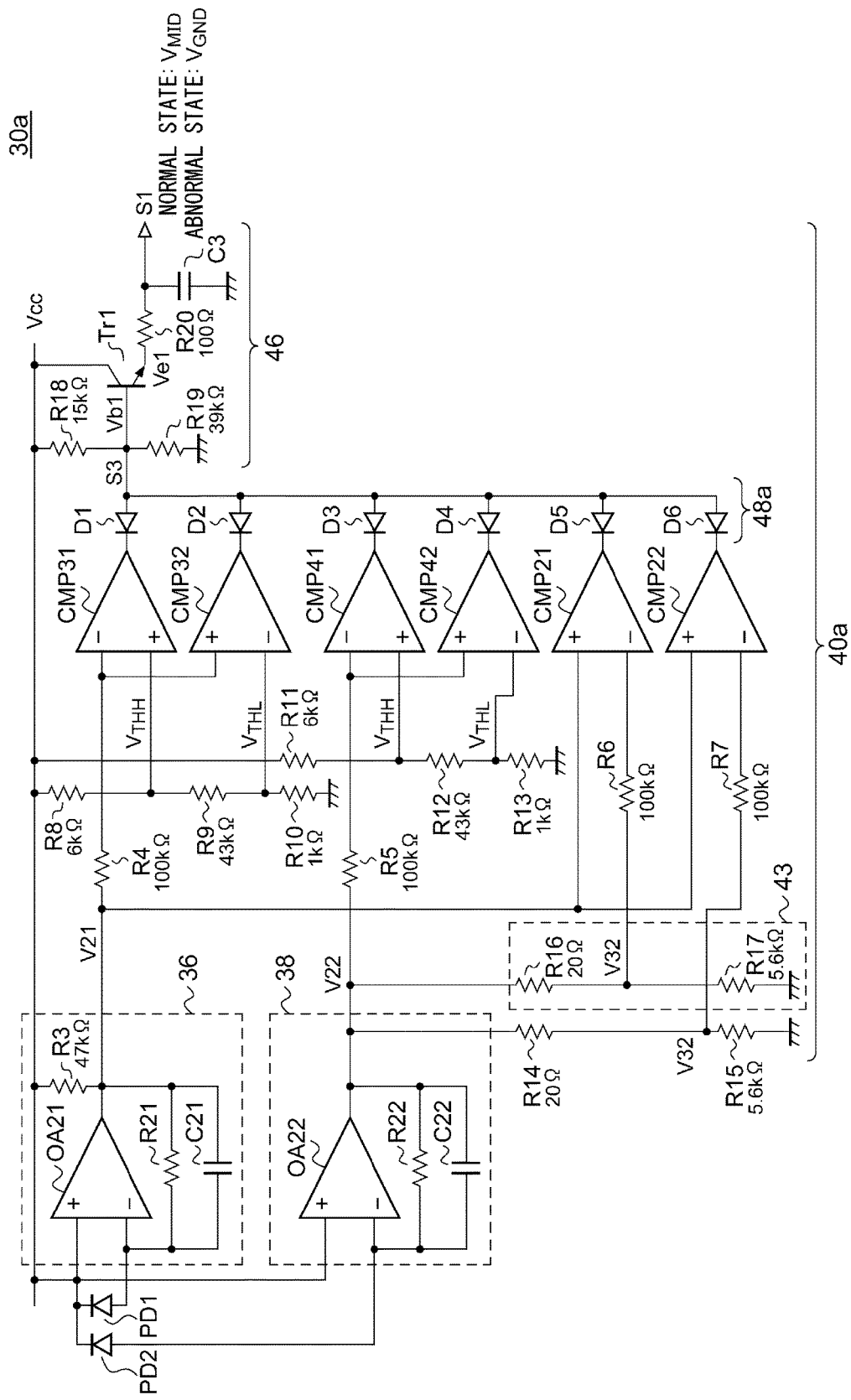
FIG. 9 is a circuit diagram showing an abnormality detector according to a second example configuration.

FIG. 9 is a circuit diagram showing an abnormality detector 30a according to a second example configuration. In connection with the first current/voltage conversion circuit 36 and the second current/voltage conversion circuit 38, capacitors C21 and C22 are provided in order to provide noise removal. A voltage dividing circuit including resistors R8 through R10 divides the power supply voltage $V_{CC}$ so as to generate the threshold voltages $V_{THH}$ and $V_{THL}$. A voltage dividing circuit including resistors R11 through R13 operates in the same manner.

When deviation occurs in the power supply voltage $V_{CC}$, this leads to a change in the saturation level of the amplifier output. In a case in which the threshold voltages $V_{THH}$ and $V_{THL}$ are each set to a fixed value, in some cases, such deviation of the power supply voltage $V_{CC}$ leads to a false detection of an abnormality. In order to solve such a problem, by generating the boundaries of the voltage range, i.e., the threshold voltages $V_{THH}$ and $V_{THL}$, based on a voltage obtained by dividing the power supply voltage $V_{CC}$, such an arrangement is capable of adjusting the threshold voltages $V_{THH}$ and $V_{THL}$ according to a change in the power supply voltage $V_{CC}$. Thus, such an arrangement is capable of preventing such false detection.

The abnormality detector 30a further includes a voltage dividing circuit 43 including the resistors R16 and R17, in addition to the components of the abnormality detector 30 shown in FIG. 6. Description will be made regarding the reason for this.

With such an example configuration shown in FIG. 6, when the output light intensity is small, such an arrangement provides the detection currents $I_{SC1}$ and $I_{SC2}$ each having a small value. In this case, there is only a small difference between the first detection voltage V21 and the second detection voltage V22. Accordingly, in a case in which there is non-negligible noise, variation in the circuit elements, offset voltage of the operational amplifier or the voltage comparator, or the like (which will be referred to as "error factors" hereafter), and when the output light intensity is small, in some cases, the magnitude relation between the first detection voltage V21 and the second detection voltage V22 is wrongly reversed, which leads to a problem of false detection of an abnormality. Alternatively, in some cases, such an arrangement is not able to detect an abnormality even when there actually is an abnormality, which is also a problem.

In order to solve such a problem, a judgment unit 40a offsets at least one of the first detection voltage V21 and the second detection voltage V22 so as to increase the difference between them. The judgement unit 40a judges the presence or absence of an abnormality based on the offset detection voltages V21 and V22.

In the present embodiment, the voltage dividing circuit including the resistors R16 and R17 is provided in order to offset the second detection voltage V22 toward the low electric potential side. The voltage comparator CMP21 compares the second detection voltage V32 thus offset by the voltage dividing circuit with the first detection voltage V21.

Figure 10:
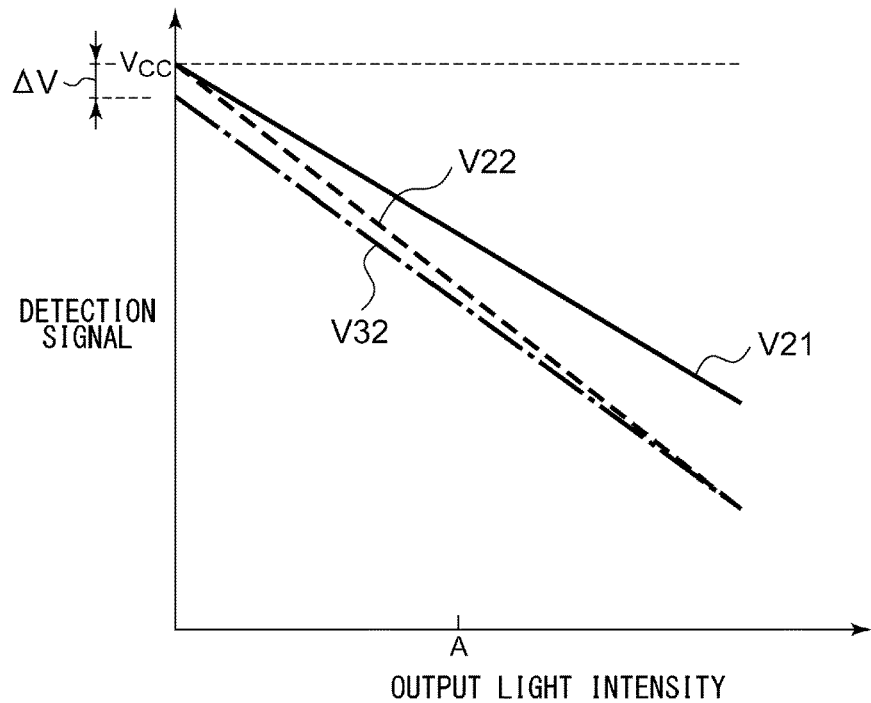
FIG. 10 is a diagram showing the relation between the intensity of the output light, the first detection voltage, and the second detection voltage, obtained by the abnormality detector shown in FIG. 9 when the phosphor operates normally.

FIG. 10 is a diagram showing the relation between the output light intensity, the first detection voltage V21, and the second detection voltage V22, in a case of employing the abnormality detector 30a shown in FIG. 9 when the phosphor 14 operates normally. With the abnormality detector 30a, the second detection voltage V32 after voltage division is represented by the following Expression (5).

$$V32 = R17/(R16+R17) \times V22$$

$$= R17/(R16+R17) \times V_{CC} - R17/(R16+R17) \times R22 \times I_{SC2} \quad (5)$$

That is to say, the y-intercept of the second detection voltage V32 shown in FIG. 10 is offset so as to increase the difference in the y-intercept between the first detection voltage V21 and the second detection voltage V32. The offset width $\Delta V$ is represented by $V_{CC} \times R16/(R16+R17)$. That is to say, the offset width $\Delta V$ can be adjusted by means of the resistors R16 and R17. For example, description will be made assuming that the offset voltage of the voltage comparator CMP21 acts as a dominant error factor. In this case, the offset width $\Delta V$ is preferably set to a value (e.g., 20 mV) that is slightly larger than the offset voltage of the voltage comparator CMP21.

With the abnormality detector 30a, such an arrangement provides improved detection precision even when the output light intensity is small. In particular, such an arrangement shown in FIG. 9 requires only two resistors R16 and R17 included in the voltage dividing circuit. Thus, such an arrangement requires only a low cost and a small circuit area to provide improved detection precision.

Furthermore, as described above, in a case of employing such a voltage dividing circuit including the resistors R16 and R17, such an arrangement provides the divided second detection voltage V32 having a slope with an absolute value that is smaller than the absolute value in a case in which such a voltage dividing circuit is not employed. Accordingly, in a range A in which the output light has a sufficiently large intensity, the offset width $\Delta V$ provided by the voltage dividing circuit has a sufficiently small effect as compared with a range in which the output light has a small intensity. Thus, such an arrangement has only a negligible effect on the detection value.

It can be clearly understood that, by providing such a voltage dividing circuit comprising the resistors R16 and R17, and by optimizing the resistance value of the second resistor R22, such an arrangement allows the slope of the second detection voltage V32 and the offset width $\Delta V$ to be designed independently as desired.

It should be noted that a combination of the resistors R14 and R15 and the voltage comparator CMP22 is configured as a replica of the combination of the resistors R16 and R17 and the voltage comparator CMP21. That is to say, such an arrangement provides a redundant configuration. Accordingly, such a redundant configuration may be omitted.

Each voltage comparator CMP has a push-pull output configuration. With such an arrangement, when an abnormality has been detected, the output is set to the low level ($V_{GND}$). When a normal state has been detected, the output is set to the high level. The outputs of such multiple voltage comparators are supplied to an OR circuit 48a including diodes D1 through D6 each having an anode coupled to a common node. Also, such voltage compactors CMP may be each configured to have an open-collector (open-drain) configuration. With such an arrangement, the diodes D1 through D6 may be omitted.

A level shift circuit 46 shifts the level of a signal S3 that can switch between two states, i.e., between the high-impedance level and the $V_{GND}$ level, so as to generate the abnormality detection signal S1 that can switch between a middle level $V_{MID}$ and the ground level $V_{GND}$.

When the outputs of all the voltage comparators are each set to the high level, the base voltage Vb1 of a transistor Tr1 is represented by Vb1=$V_{CC}$×R19/(R18+R19). In this state, the level shift circuit 46 outputs the emitter voltage (=Vb1−Vbe) of the transistor Tr1 as the abnormality detection signal S1 having the middle level $V_{MID}$. A resistor R20 and a capacitor C3 are provided in order to protect the circuit from static electricity.

When at least one of the voltage comparators outputs the low-level signal as a result of detecting an abnormality, the electric potential at the base of the transistor Tr1 falls, which turns off the transistor Tr1. As a result, the emitter is set to the high-impedance state. The emitter of the transistor Tr1 is pulled down by a reception circuit of the lighting circuit 120 side. With such an arrangement, the abnormality detection signal S1 is set to the low-level voltage $V_{GND}$.

By providing the level shift circuit 46, the abnormality detection signal S1, which can be switched between two levels, is transmitted in the form of either the middle level $V_{MID}$ or otherwise one from among the high level or the low level ($V_{GND}$ in this example), instead of being transmitted in the form of either the high level or otherwise the low level. When the lighting circuit 120 receives the abnormality detection signal S1 having the middle level $V_{MID}$, the lighting circuit 120 instructs the light source 10 to operate normally. When the abnormality detection signal S1 deviates from the middle level $V_{MID}$, the lighting circuit 120 executes a suitable protection operation such as turning off the light source 10.

That is to say, in the signal design for the abnormality detection signal S1, the asserted level that indicates an abnormality is assigned to the middle level $V_{MID}$, which cannot occur when an abnormality such as an open-circuit fault, a short-circuit fault, or the like has occurred. Furthermore, the negated level that indicates the normal state is assigned to the voltage level that can occur when such an abnormality has occurred. Such an arrangement is capable of executing a suitable protection operation even when a short-circuit fault or an open-circuit fault has occurred in the line via which the abnormality detection signal S1 is to be transmitted, in addition to when the abnormality detection signal S1 indicates an abnormality (when the abnormality detection signal S1 is asserted).

Description has been made above regarding an aspect of the present invention with reference to the first embodiment. The above-described first embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

First Modification

Figure 11:
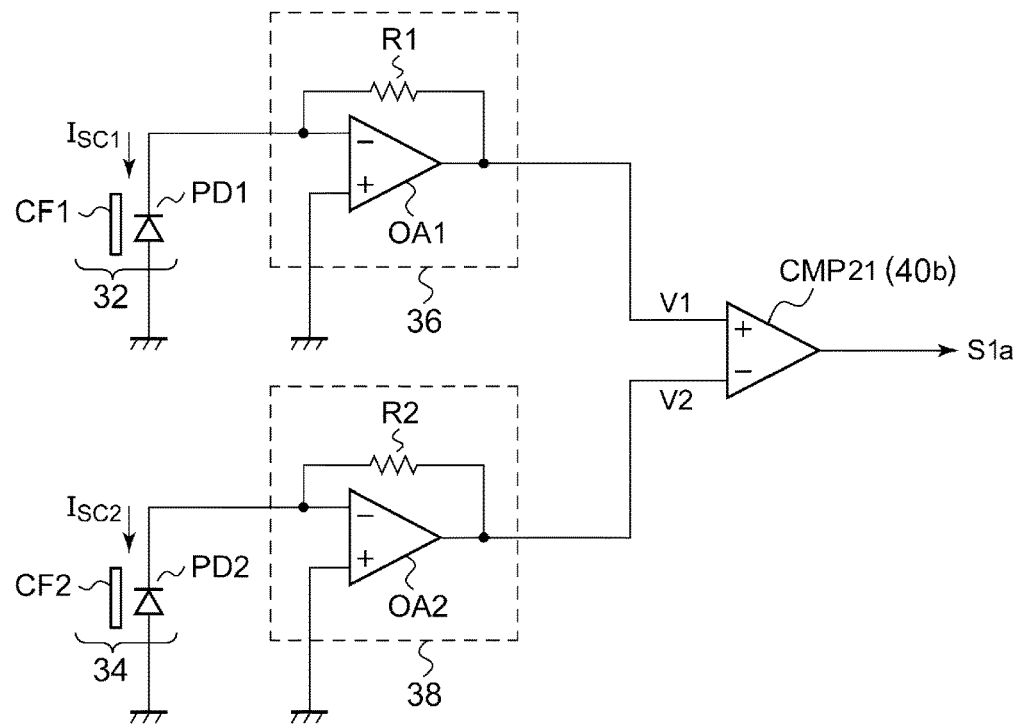
FIG. 11 is a circuit diagram showing an abnormality detector according to a first modification.

FIG. 11 is a circuit diagram showing an abnormality detector 30b according to a first modification. Description has been made with reference to FIG. 6 regarding an arrangement employing the current/voltage conversion circuit 36 (38) configured as an inverting converter. Also, the current/voltage conversion circuit may be configured as a non-inverting converter. The first current/voltage conversion circuit 36 includes a first operational amplifier OA1 in addition to the first resistor R1. The first operational amplifier OA1 is arranged such that its inverting input terminal (−) is coupled to the first photosensor 32, and a fixed voltage is applied to its non-inverting input terminal (+). The fixed voltage is configured as the ground voltage, for example. The first resistor R1 is arranged between the inverting input terminal (−) and the output terminal of the first operational amplifier OA1.

More specifically, the inverting input terminal (−) of the first operational amplifier OA1 is coupled to the cathode of the first photodiode PD1 of the first photosensor 32. A fixed voltage (ground voltage) is applied to the anode of the first photodiode PD1.

The voltage level of the first detection voltage V1 generated by the first current/voltage conversion circuit 36 is represented by the following Expression (6).

$$V1 = R1 \times I_{SC1} \quad (6)$$

The second current/voltage conversion circuit 38 has the same configuration as that of the first current/voltage conversion circuit 36, including a second operational amplifier OA2 in addition to the second resistor R2. The voltage level of the output V2 of the second current/voltage conversion circuit 38 is represented by the following Expression (7).

$$V2 = R2 \times I_{SC2} \quad (7)$$

With the first current/voltage conversion circuit 36 shown in FIG. 11, by virtually grounding the first operational amplifier OA1, the ground voltage is applied to each of the anode and the cathode of the first photodiode PD1. That is to say, the voltage difference between the anode and the cathode of the first photodiode PD1 is set to substantially zero. Such an arrangement is capable of detecting light over a wide light amount range without receiving the effects of dark current. The same can be said of the second current/voltage conversion circuit 38.

A judgment unit 40b includes the voltage comparator CMP21 that makes a comparison between the first detection voltage V1 and the second detection voltage V2. When V1<V2, i.e., when the phosphor 14 operates normally, an abnormality detection signal S1a output from the voltage comparator CMP21 is set to the low level (negated). Conversely, when V1>V2, i.e., when there is an abnormality in the phosphor 14, the abnormality detection signal S1a is set to the high level (asserted). It should be noted that other comparators included in the judgment unit 40b are not shown in FIG. 1.

Second Modification

Description has been made in the embodiment regarding an arrangement in which the judgment unit 40 is configured including the voltage comparator CMP21 or the like. However, the present invention is not restricted to such an arrangement. For example, after the first detection voltage V1 and the second detection voltage V2 are respectively converted into digital values D1 and D2 by means of an A/D converter, the judgment unit 40 may perform signal processing on the digital values D1 and D2 thus converted, so as to perform the abnormality judgment.

Third Modification

Description has been made with reference to the example configuration shown in FIG. 9 regarding an arrangement in which the detection voltage is offset. The method for providing such an arrangement is not restricted to such an arrangement employing such a voltage dividing circuit comprising the resistors R16 and R17. For example, the voltage comparator CMP21 may be configured to be capable of adjusting the input offset voltage. With such an arrangement, at least one of the first detection voltage V1 and the second detection voltage V2 may be offset. Such an arrangement is capable of preventing false detection of an abnormality due to error factors such as noise or the like. Alternatively, the first detection voltage V21 may be offset toward the high electric potential side. In this case, a voltage dividing circuit including a pair of resistors coupled in series may be arranged between the output V21 of the first current/voltage conversion circuit 36 and the power supply voltage $V_{CC}$. The divided voltage at a connection node that connects the pair of resistors is set to a voltage obtained by shifting the first detection voltage V21 toward the power supply voltage side.

Fourth Modification

With the abnormality detector 30b shown in FIG. 11, at least one from among the first detection voltage V1 and the second detection voltage V2 may be offset, which is also effective as a modification. Specifically, the second detection voltage V2 may be offset toward the positive electric potential side (high electric potential side). In order to provide such a function, a fixed voltage that corresponds to the offset width $\Delta V$ may preferably be applied to the non-inverting input terminal (+) of the second operational amplifier OA2.

Alternatively, a voltage dividing circuit including a pair of resistors coupled in series may preferably be arranged between the output V2 of the second current/voltage conversion circuit 38 and the power supply voltage $V_{CC}$. The divided voltage thus generated at a connection node that couples the pair of resistors is configured as a voltage obtained by shifting the second detection voltage V2 toward the power supply voltage $V_{CC}$ side.

Second Embodiment

The second embodiment relates to a package housing the first photodiode PD1 and the second photodiode PD2 each configured as an abnormality detector.

In a case in which such photodiodes are employed in a vehicle, in order to secure long-term reliability even in an inhospitable environment in which they are exposed to high temperature and high humidity, thermal shock, or the like, a CAN package is employed. In a case in which a pair of photodiodes are housed in a single package, the pair of photodiodes are arranged such that their cathodes are coupled so as to form a common cathode, and their cathodes are electrically coupled to a metal casing.

In a case of employing such a pair of photodiodes configured in a common cathode manner housed in a CAN package, the configuration shown in FIG. 11 cannot be employed. Accordingly, the current/voltage conversion circuits 36 and 38 are each required to be configured as an inverting converter as shown in FIG. 6 or 9. However, in a case in which the abnormal detector 30 shown in FIG. 6 or 9 is configured as such a photodiode pair housed in a CAN package, the electric potential at the cathode is set to the power supply voltage $V_{CC}$. Accordingly, the electric potential at the metal casing is also set to the power supply voltage $V_{CC}$. In many cases, other metal structures mounted within the lighting device are grounded in order to protect the circuit from electromagnetic noise. Accordingly, if a contact occurs between such a metal casing and other metal structures in the vicinity of the metal casing, this leads to a short-circuit fault between the power supply and the ground. This leads to a problem in that the photodiodes cannot operate normally. In addition, this leads to a problem in that other circuit blocks that share the power supply voltage $V_{CC}$ cannot operate normally.

Figure 12B:
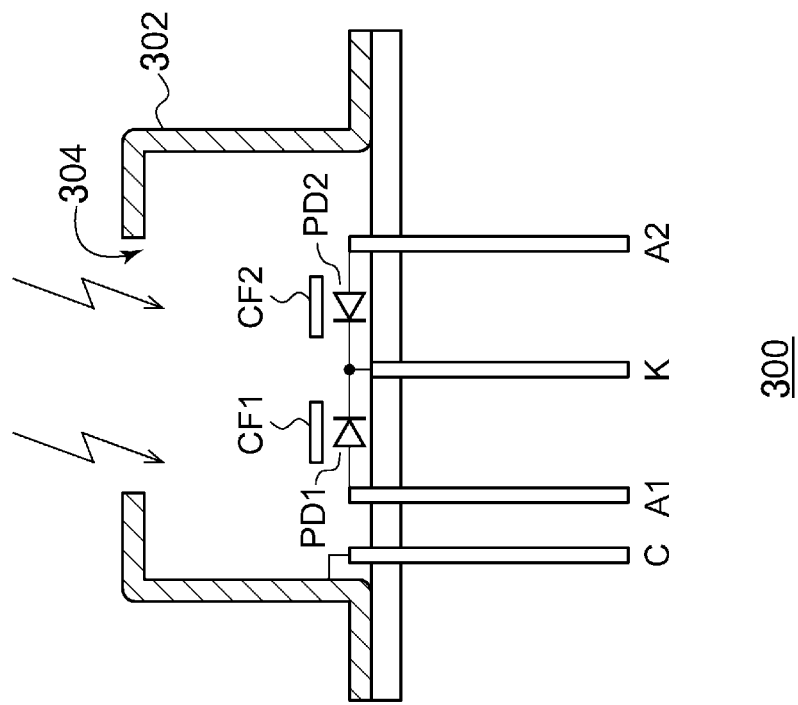
FIG. 12B is a cross-sectional view of a schematic configuration thereof.
Figure 12A:
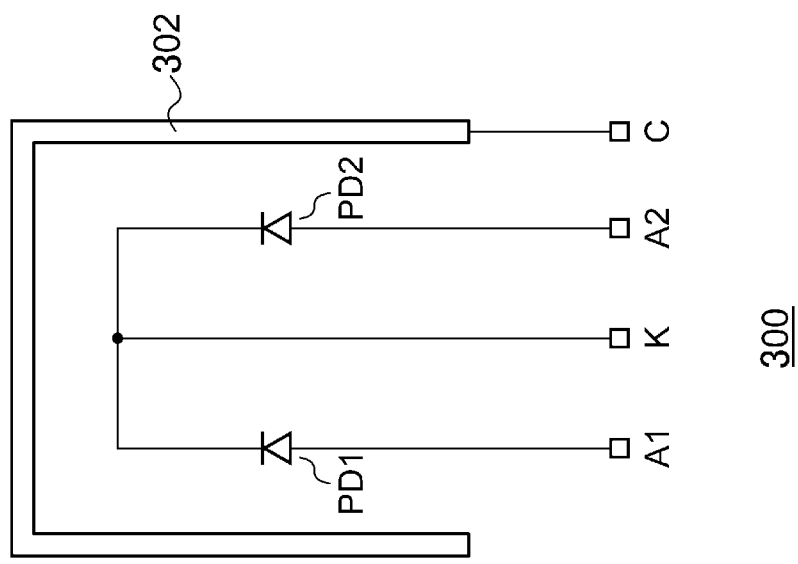
FIG. 12A is an equivalent circuit diagram showing a package including a photodiode pair.

In order to solve such a problem, the abnormality detector 30 shown in FIG. 6 or 9 is housed in the form of a photodiode module 300 having the following configuration. FIG. 12A is an equivalent circuit diagram showing the photodiode module 300 including a pair of photodiodes PD1 and PD2. FIG. 12B is a cross-sectional view showing a schematic configuration thereof. The photodiode module 300 includes anode terminals A1 and A2, a cathode terminal K, a pair of photodiodes PD1 and PD2, and a metal casing 302. The metal casing 302 is electrically insulated from the cathode terminal K. An opening 304 is formed in the top face of the metal casing, which allows the photodiodes PD1 and PD2 to receive light. The photodiodes PD1 and PD2 may each be configured to have a light-receiving portion covered by a color filter.

With such an arrangement employing such an abnormality detector 30, a weak current on the order of μA flows through each of the photodiodes PD1 and PD2. Furthermore, each current/voltage conversion circuit has a very high input impedance. Accordingly, it can be said that such an arrangement provides the abnormality detector 30 with poor noise resistance. In order to solve such a problem, the photodiode module 300 is preferably provided with a casing terminal C electrically coupled to the metal casing 302. In this case, by grounding the casing terminal C, the metal casing 302 functions as a shield, thereby providing improved electromagnetic noise resistance.

Third Embodiment

Figure 13:
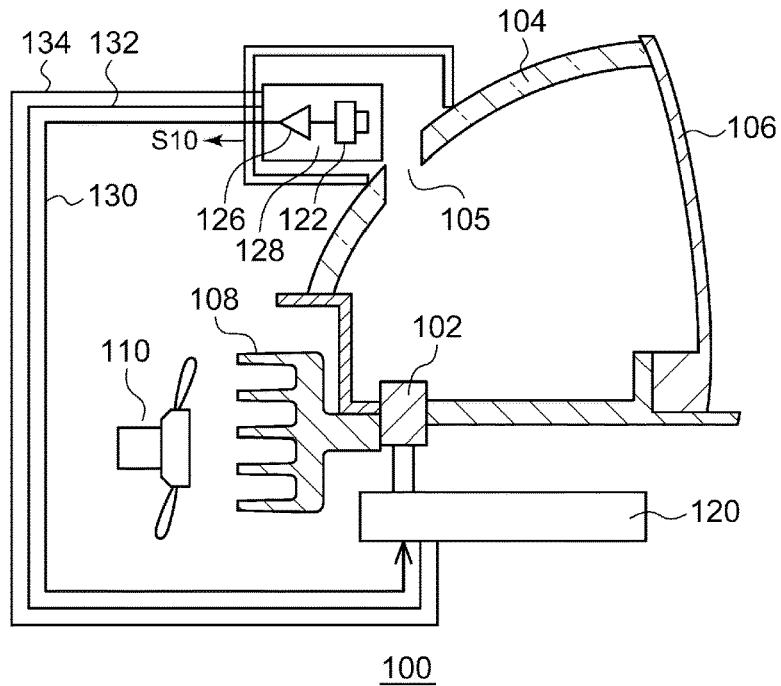
FIG. 13 is a cross-sectional view of a vehicular lighting device according to a third embodiment.

FIG. 13 is a cross-sectional diagram showing a vehicular lighting device 100 according to a third embodiment. Description of the same configuration as that shown in FIG. 3 will be omitted.

The photosensor 122 receives light from the light source 102. A preamplifier 126 amplifies the output of the photosensor 122, so as to generate a detection signal that indicates the amount of received light. The lighting circuit 120 drives the light source 102 based on at least the output of the preamplifier 126. For example, the photosensor is arranged so as to receive light that has passed through a slit 105 or a pinhole formed in the reflector 104.

For example, the photosensor 122 is provided in order to detect an abnormality. Upon detection of an abnormality as a result of signal processing performed on the detection signal, the lighting circuit 120 stops the driving operation for the light source 102. Alternatively, the photosensor 122 may be provided in order to provide a feedback control operation for controlling the light amount supplied by the light source 102. With such an arrangement, the lighting circuit 120 may control the driving current to be supplied to the light source 102 according to the detection signal.

The photosensor 122 and the preamplifier 126 are mounted on a sub-base member 128 that is separate from a base member on which the lighting circuit 120 is mounted. The sub-base member 128 may be configured as a printed circuit board. Also, the sub-base member 128 may be configured as a metal substrate or a flexible printed circuit board.

The sub-base member 128 and the lighting circuit 120 are coupled via a signal line 130 via which a signal S10 that corresponds to the output of the preamplifier 126 is transmitted, and a power supply line 132 via which the power supply voltage $V_{DD}$ is supplied from the lighting circuit 120 to the sub-base member 128. Furthermore, the sub-base member 128 and the lighting circuit 120 are coupled via a ground line 134 such that a common ground electric potential is shared by the sub-base member 128 and the lighting circuit 120. It should be noted that a metal member of the vehicular lighting device 100 may be employed instead of such a ground line 134.

The above is the configuration of the vehicular lighting device 100. With the vehicular lighting device 100, by mounting the photosensor 122 and the preamplifier 126 on the same sub-base member 128 such that they are arranged in the vicinity of each other, such an arrangement allows the signal S10 that corresponds to the amplified detection signal or otherwise a signal that corresponds to the detection signal to be transmitted to the lighting circuit 120 via wiring (a signal line 130). That is to say, such an arrangement transmits a signal having a large amplitude via wiring instead of transmitting a weak signal output from the photosensor 122. Thus, such an arrangement provides improved noise resistance, thereby providing improved detection precision.

The present invention encompasses various arrangements derived with reference to FIG. 13 and based on the aforementioned description. Description will be made below regarding specific examples.

Example 1

Figure 3:
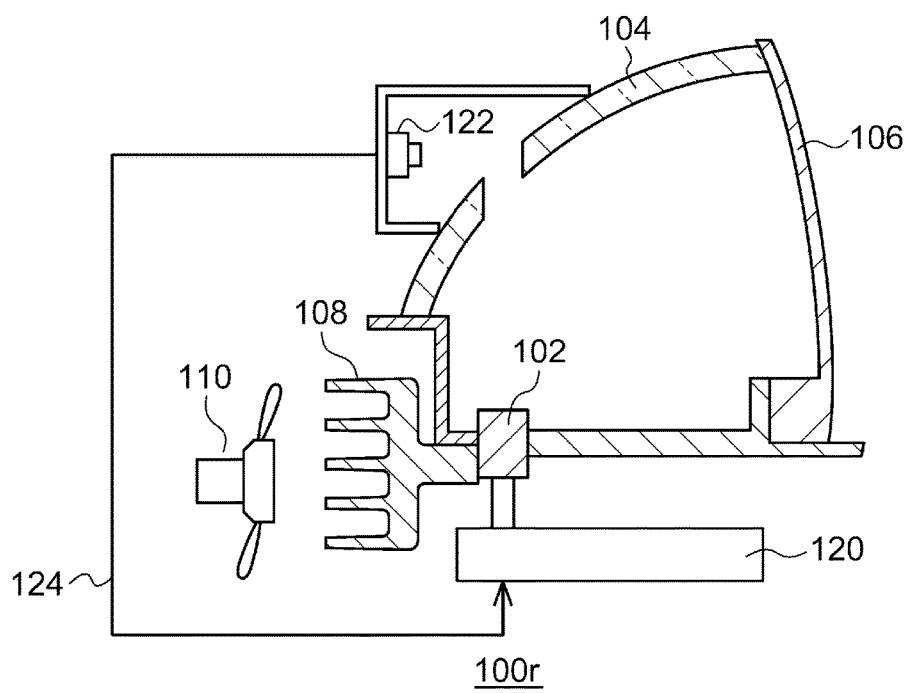
FIG. 3 is a cross-sectional view of a light source of a vehicular lighting device.

As with the light source 10 shown in FIG. 3, the light source 102 mainly includes a laser diode 12, a phosphor 14, an optical system 16, and a housing 18. The light source 102 outputs output light 24 having a spectrum as shown in FIG. 4. With such an example, the photosensor 122 is employed in order to detect an abnormality in the light source 102 having the configuration shown in FIG. 3.

Figure 14:
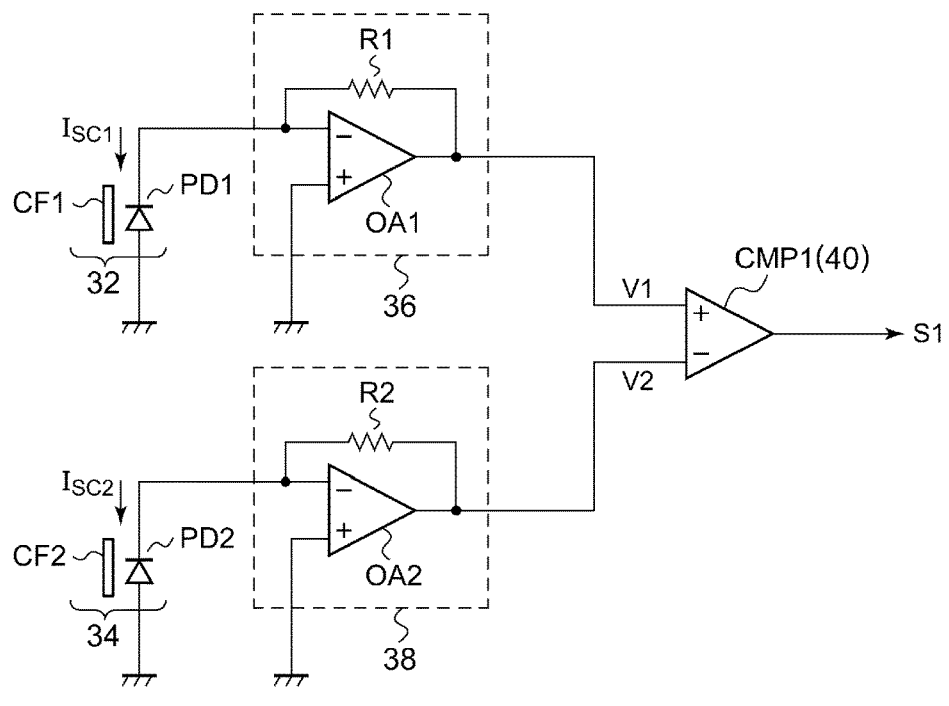
FIG. 14 is a circuit diagram showing an abnormality detector according to an example 1.

FIG. 14 is a circuit diagram showing an abnormality detector 30c according to an example 1. The abnormality detector 30c receives a part of the output light 24, so as to judge the presence or absence of an abnormality in the light source 10, and more specifically, to judge the presence or absence of an abnormality in the phosphor 14. Examples of such an abnormality in the phosphor 14 include a crack in the phosphor 14, the phosphor 14 falling away from the housing, aging degradation, and the like. However, the abnormality is not particularly restricted in kind.

The abnormality detector 30c includes a first photosensor 32, a second photosensor 34, a first preamplifier 36, a second preamplifier 38, and a judgment unit 40. The first photosensor 32 is configured to be sensitive to the wavelength of the excitation light 20, and to be substantially insensitive to the wavelength of the fluorescent light 22. The first photosensor 32 receives a part of the output light 24, and generates a first current $I_{SC1}$ that corresponds to the intensity of the excitation light 20 after it passes through the phosphor 14. In contrast, the second photosensor 34 is configured to be sensitive to the wavelength of the fluorescent light 22, and to be insensitive to the wavelength of the excitation light 20. The second photosensor 34 receives a part of the output light 24, and generates a second current $I_{SC2}$ that corresponds to the intensity of the fluorescent light 22 emitted from the phosphor 14.

The first photosensor 32 includes a first photodiode PD1 and a first color filter CF1. The first color filter CF1 is configured to have a high transmittance for blue light that matches the wavelength of the excitation light 20, and to have a low transmittance for the wavelength of the fluorescent light 22. The second photosensor 34 includes a second photodiode PD2 and a second color filter CF2. The second color filter CF2 is configured to have a high transmittance for a wavelength range from green to red that matches the wavelength range of the fluorescent light 22, and to have a low transmittance for blue light. As the first color filter CF1, a blue filter may be employed. As the second color filter CF2, a yellow filter, a green filter, or otherwise a red filter may be employed.

It should be noted the first photosensor 32 and the second photosensor 34 may each be provided with a suitable wavelength-dependent sensitivity, i.e., suitable wavelength selectivity, by designing the semiconductor material that forms the photosensor or by designing the device structure of the photosensor instead of designing the color filter. Also, the first photosensor 32 and the second photosensor 34 are not particularly restricted in kind. Rather, various kinds of semiconductor photosensors may be employed, examples of which include photodiodes, phototransistors, CMOS sensors, CCD sensors, and the like.

The first preamplifier 36 includes a first operational amplifier OA1 and a first resistor R1 arranged on a path of the first current $I_{SC1}$, and outputs a first detection signal V1 that corresponds to a voltage drop $V_{SC1}$ across the first resistor R1. The first detection signal V1 changes linearly according to the first current $I_{SC1}$ with a slope that corresponds to the resistance value of the first resistor R1.

The second preamplifier 38 includes a second resistor R2 arranged on a path of the second current $I_{SC2}$, and outputs a second detection signal V2 that corresponds to a voltage drop $V_{SC2}$ across the second resistor R2. The second detection signal V2 changes linearly according to the second current $I_{SC2}$ with a slope that corresponds to the resistance value of the second resistor R2.

The judgement unit 40 judges the presence or absence of an abnormality based on the first detection signal V1 and the second detection signal V2. Upon detection of an abnormality, the judgment unit 40 asserts (sets to the high level, for example) an abnormality detection signal S1.

Specifically, the first preamplifier 36 includes the first operational amplifier OA1 in addition to the first resistor R1. The first operational amplifier OA1 is arranged such that its inverting input terminal (−) is coupled to the first photosensor 32, and a fixed voltage is applied to its non-inverting input terminal (+). The fixed voltage is configured as the ground voltage, for example. The first resistor R1 is arranged between the non-inverting input terminal (+) and the output terminal of the first operational amplifier OA1.

More specifically, the inverting input terminal (−) of the first operational amplifier OA1 is coupled to the cathode of the first photodiode PD1 of the first photosensor 32. A fixed voltage (ground voltage) is applied to the anode of the first photodiode PD1.

The voltage level of the first detection voltage V1 generated by the first preamplifier 36 is represented by the following Expression (8).

$$V1 = R1 \times I_{SC1} \tag{8}$$

The second preamplifier circuit 38 has the same configuration as that of the first preamplifier 36, including a second operational amplifier OA2 in addition to the second resistor R2. The voltage level of the output V2 is represented by the following Expression (9).

$$V2 = R2 \times I_{SC2} \tag{9}$$

The judgment unit 40 includes a voltage comparator CMP1 that makes a comparison between the first detection signal V1 and the second detection signal V2. When V1<V2, i.e., when the phosphor 14 operates normally, an abnormality detection signal S1 output from the voltage comparator CMP1 is set to the low level (negated). Conversely, when V1>V2, i.e., when there is an abnormality in the phosphor 14, the abnormality detection signal S1 is set to the high level (asserted).

The above is the basic configuration of the abnormality detector 30c. Next, description will be made regarding the operation mechanism thereof.

The first detection signal V1 changes linearly according to the light amount of the excitation light 20 with a slope determined according to the resistance value of the first resistor R1. Similarly, the second detection signal V2 changes linearly according to the light amount of the fluorescent light 22 with a slope determined according to the resistance value of the second resistor R2. With such an arrangement, when the phosphor 14 operates normally, there is a proportional relation between the intensity of the excitation light 20, the intensity of the fluorescent light 22, and the intensity of the output light 24 emitted from the light source 10. Accordingly, when the phosphor 14 operates normally, the ratio between the first detection signal V1 and the second detection signal V2 exhibits a substantially constant value. In contrast, when the excitation light 20 is directly emitted due to the occurrence of an abnormality in the phosphor 14, the intensity ratio between the excitation light 20 and the fluorescent light 22 included in the output light 24 deviates from that in the normal state, leading to a change in the ratio between the first detection signal V1 and the second detection signal V2. With the abnormality detector 30c shown in FIG. 14, by appropriately designing the resistance values of the first resistor R1 and the second resistor R2, and by monitoring the first detection signal V1 and the second detection signal V2, such an arrangement is capable of detecting, in a simple and sure manner, an abnormality that can occur in the phosphor 14 regardless of the intensity of the white light, i.e., regardless of the output level of the light source.

FIG. 5A is a diagram showing the relation between the output light intensity, the first detection signal V1, and the second detection signal V2, when the phosphor 14 operates normally. FIG. 5B is a diagram showing the relation between the output light intensity, the first detection signal V1, and the second detection signal V2, when there is an abnormality in the phosphor 14. The mechanism of the abnormality detection is the same as that described with reference to FIG. 4.

Figure 15:
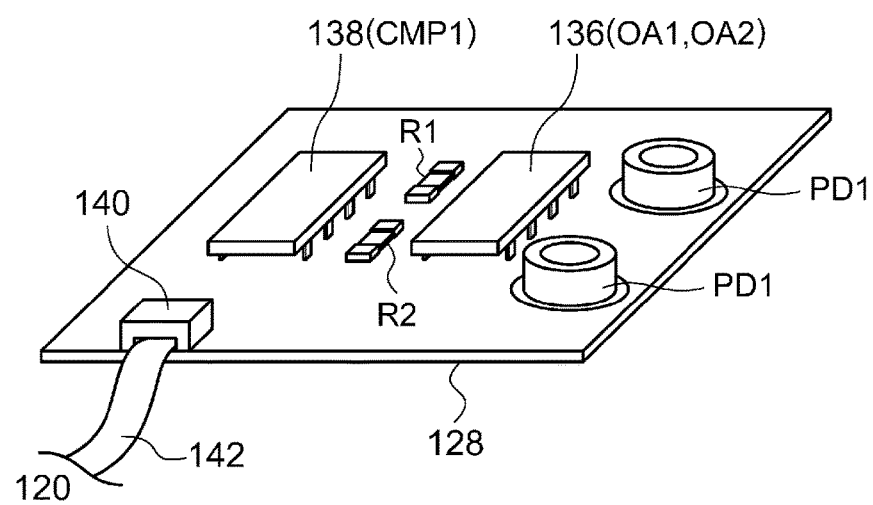
FIG. 15 is a perspective view showing the abnormality detector shown in FIG. 14.

FIG. 15 is a perspective view showing the abnormality detector 30c shown in FIG. 14. The first photosensor 32 and the second photosensor 34 shown in FIG. 14 correspond to the photosensor 122 shown in FIG. 13. The first preamplifier 36 and the second preamplifier 38 correspond to the preamplifier 126 shown in FIG. 13.

The components of the abnormality detector 30c are mounted on the sub-base member 128. The sub-base member 128 is provided with a connector 140, which allows it to be coupled to the lighting circuit 120 via a cable 142. The cable 142 includes the signal line 130, the power supply line 132, and the ground line 134, as described above. An operational amplifier IC 136 includes the first operational amplifier OA1 and the second operational amplifier OA2. An operational amplifier IC 138 includes the voltage comparator CMP1. Also, a capacitor may be arranged in parallel with the first resistor R1 and with the second resistor R2.

Such an example configuration allows the operational amplifier IC 136 to be arranged in the vicinity of the first photodiode PD1 and the second photodiode PD2, thereby providing improved noise resistance. In addition, by mounting the voltage comparator CMP1 on the sub-base member 128, such an arrangement allows the abnormality detection signal S1 to be transmitted in the form of a digital binary signal via the signal line 130 included in the cable 142. Thus, such an arrangement provides further improved noise resistance.

The abnormality detector 30c shown in FIG. 14 can be configured in the form of a small-scale circuit comprising a pair of photodiodes, a pair of operational amplifiers, a pair of resistors, and a single comparator. In addition, the first preamplifier 36 has a current/voltage conversion gain (transimpedance) that depends on only the first resistor R1. Furthermore, the second preamplifier 38 has a current/voltage conversion gain that depends on only the second resistor R2. Such an arrangement allows the effects of variation in the circuit elements to be reduced, thereby providing high-precision abnormality detection.

With the first preamplifier 36 shown in FIG. 14, by virtually grounding the first operational amplifier OA1, the ground voltage is applied to each of the anode and the cathode of the first photodiode PD1. That is to say, the voltage difference between the anode and the cathode of the first photodiode PD1 is set to substantially zero. Such an arrangement is capable of detecting light over a wide light amount range without receiving the effects of dark current. The same can be said of the second preamplifier 38.

Example 2

Figure 16:
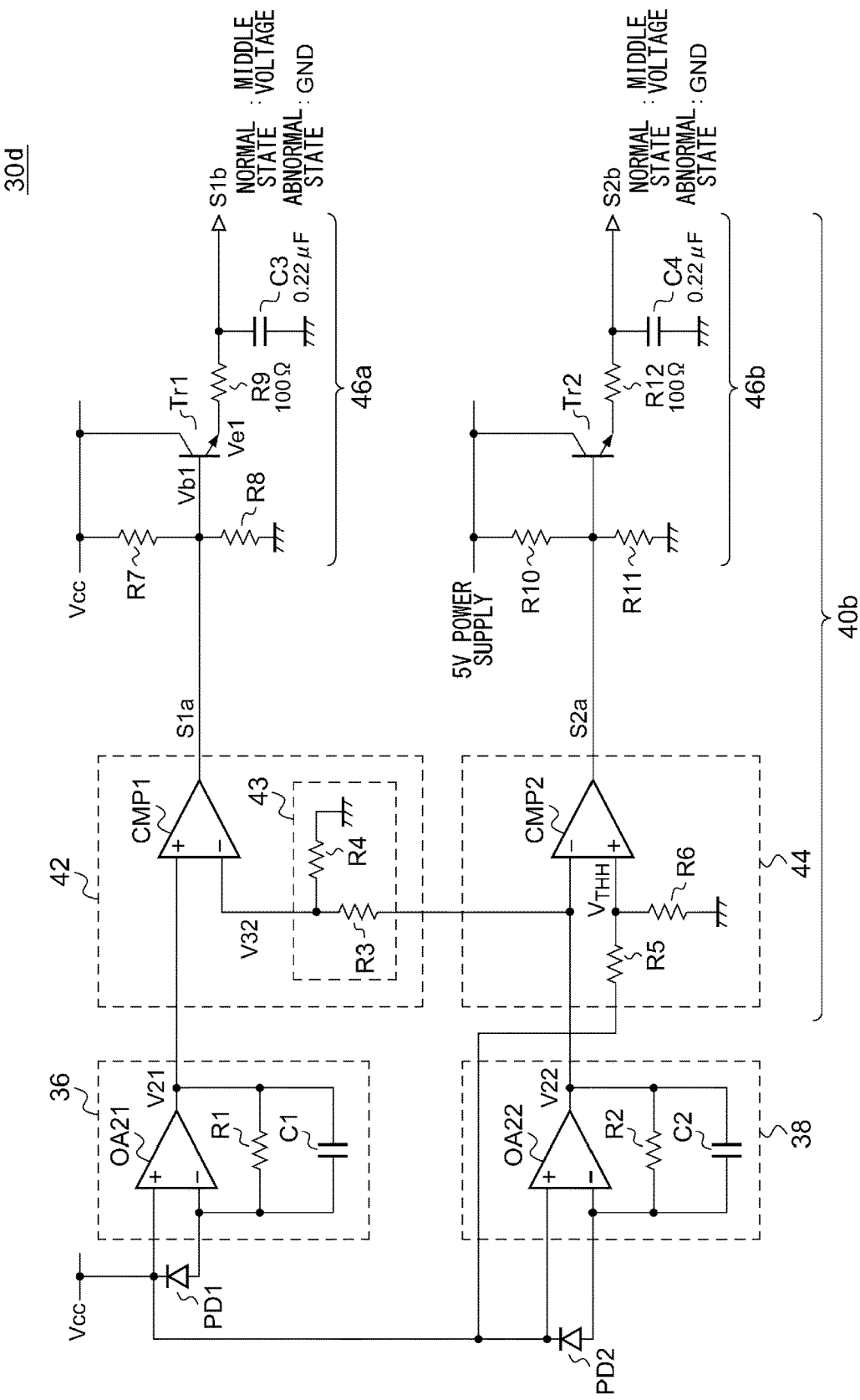
FIG. 16 is a circuit diagram showing an abnormality detector according to an example 2.

FIG. 16 is a circuit diagram showing an abnormality detector 30d according to an example 2. With such an example, the first preamplifier 36 and the second preamplifier 38 are each configured as an inverting amplifier. All the components of the abnormality detector 30d are mounted on the sub-base member 128.

The first preamplifier 36 includes a first operational amplifier OA21 arranged such that its inverting input terminal (−) is coupled to an anode of the first photodiode PD1, its non-inverting input terminal (+) is coupled to a cathode of the first photodiode PD1, and a predetermined fixed voltage is applied to its non-inverting input terminal (+). For example, the fixed voltage may be configured as the power supply voltage $V_{CC}$. Also, the fixed voltage may be set to other voltage levels.

The voltage level of the first detection voltage V21 generated by the first preamplifier 36 shown in FIG. 16 is represented by the following Expression (10).

$$V21 = V_{CC} - R1 \times I_{SC1} \quad (10)$$

The second preamplifier 38 is configured in the same manner as the first preamplifier 36. The voltage level of the output V22 is represented by the following Expression (11).

$$V22 = V_{CC} - R2 \times I_{SC2} \quad (11)$$

Description will be made again with reference to FIGS. 7A and 7B. FIG. 7A is a diagram showing the relation between the output light intensity, the first detection signal V21, and the second detection signal V22, when the phosphor 14 operates normally. FIG. 7B is a diagram showing the relation between the output light intensity, the first detection signal V21, and the second detection signal V22, when there is an abnormality in the phosphor 14. As described above, the resistance values of the resistors R1 and R2 are designed such that the relation expressions (1) and (2) hold true. Accordingly, when the phosphor 14 operates normally, the relation V21>V22 holds true. Conversely, when there is an abnormality, the relation V22<V21 holds true. When V21>V22, i.e., when the phosphor 14 operates normally, the voltage comparator CMP21 shown in FIG. 16 sets the abnormality detection signal S1 to the low level (signal negation). Conversely, when V21<V22, i.e., when there is an abnormality, the voltage comparator CMP21 sets the abnormality detection signal S1 to the high level (signal assertion).

As shown in FIGS. 7A and 7B, when the output light intensity is small, such an arrangement provides the detection currents $I_{SC1}$ and $I_{SC2}$ each having a small value. In this case, there is only a small difference between the first detection voltage V21 and the second detection voltage V22. Accordingly, in a case in which there is non-negligible noise, circuit element variation, operational amplifier or voltage comparator offset voltage, or the like (which will be referred to as "error factors" hereafter), and when the output light intensity is small, in some cases, the magnitude relation between the first detection voltage V21 and the second detection voltage V22 is wrongly reversed, which leads to a problem of false detection of an abnormality. Alternatively, in some cases, such an arrangement is not able to detect an abnormality even when there actually is an abnormality, which is also a problem. As can be clearly understood with reference to FIG. 5, such a problem can occur in the example 1 shown in FIG. 14.

In order to solve such a problem, a judgment unit 40b offsets at least one of the first detection voltage V21 and the second detection voltage V22 so as to increase the difference between them. The judgement unit 40b judges the presence or absence of an abnormality based on the offset detection voltages V21 and V22.

A phosphor abnormality detection circuit 42 includes a voltage dividing circuit 43 in addition to the voltage comparator CMP21. The voltage dividing circuit 43 comprising resistors R3 and R4 divides the second detection voltage V22. The voltage comparator CMP21 compares the second detection signal V32 thus divided with the first detection signal V21, so as to generate the abnormality detection signal S1a.

Description will be made again referring to FIG. 10. FIG. 10 is a diagram showing the relation between the output light intensity, the first detection voltage V21, and the second detection voltage V22 in a case of employing the phosphor abnormality detection circuit 42 shown in FIG. 16 when the phosphor 14 operates normally. With the phosphor abnormality detection circuit 42, the second detection voltage V32 after voltage division is represented by the following Expression (12).

$$V32 = R4/(R3 + R4) \times V22 \qquad (12)$$
$$= R4/(R3 + R4) \times V_{CC} - R4/(R3 + R4) \times R2 \times I_{SC2}$$

That is to say, the y-intercept of the second detection signal V32 shown in FIG. 10 is offset so as to increase the difference in the y-intercept between the first detection signal V21 and the second detection voltage V32. The offset width ΔV is represented by $V_{CC} \times R3/(R3+R4)$. That is to say, the offset width ΔV can be adjusted by means of the resistors R3 and R4. For example, description will be made assuming that the offset voltage of the voltage comparator CMP21 acts as a dominant error factor. In this case, the offset width ΔV is preferably set to a value (e.g., 20 mV) that is slightly larger than the offset voltage of the voltage comparator CMP21.

Such an embodiment provides improved detection precision even when the output light intensity is small. In particular, such an arrangement shown in FIG. 16 requires only two resistors R3 and R4 included in the voltage dividing circuit 43. Thus, such an arrangement requires only a low cost and a small circuit area to provide improved detection precision.

Furthermore, as described above, in a case of employing such a voltage dividing circuit 43, such an arrangement provides the divided second detection voltage V32 having a slope with an absolute value that is smaller than the absolute value in a case in which such a voltage dividing circuit 43 is not employed. Accordingly, in a range A in which the output light has a sufficiently large intensity, the offset width ΔV provided by the voltage dividing circuit 43 has a sufficiently small effect as compared with a range in which the output light has a small intensity. Thus, such an arrangement has only a negligible effect on the detection value.

It can be clearly understood that, by providing such a voltage dividing circuit 43, and by optimizing the resistance value of the second resistor R2, such an arrangement allows the slope of the second detection voltage V32 and the offset width ΔV to be designed independently as desired.

The voltage comparator CMP1 of the phosphor abnormality detection circuit 42 has an open-collector (open-drain) output configuration. With such an arrangement, when an abnormality is detected, the output of the voltage comparator CMP1 is set to the low level ($V_{GND}$). When a normal state is detected, the output of the voltage comparator CMP1 is set to the open state (high-impedance state). The judgment unit 40b shifts the level of the detection signal S1a that can switch between two states, i.e., between the high-impedance level and the $V_{GND}$ level, so as to generate a detection signal S1b that can switch between a middle level $V_{MID}$ and the ground level $V_{GND}$. The judgment unit 40b outputs the detection signal S1b thus generated to the lighting circuit 120.

A first level shift circuit 46a is arranged as a downstream stage of the phosphor abnormality detection circuit 42. When the output of the voltage comparator CMP1 is set to the high-impedance state, the base voltage of the transistor Tr1 is represented by $Vb1 = V_{CC} \times R8/(R7+R8)$. With such an arrangement, the first level shift circuit 46a outputs the emitter voltage (Ve1=Vb1−Vbe) of the transistor Tr1 as the abnormality detection signal S1b having the middle level $V_{MID}$. A resistor R9 and a capacitor C3 are provided in order to protect the circuit from static electricity.

When the output of the voltage comparator CMP1 is set to the low level $V_{GND}$, the transistor Tr1 is turned off, which sets the emitter of the transistor Tr1 to the high-impedance state. The emitter of the transistor Tr1 is pulled down by a reception circuit of the lighting circuit 120 side. As a result, the output S1b of the first level shift circuit 46a is set to the low level $V_{GND}$.

By providing the level shift circuit 46a, the abnormality detection signal S1b, which can be switched between two levels, is transmitted in the form of either the middle level $V_{MID}$ or otherwise one from among the high level or the low level ($V_{GND}$ in this example), instead of being transmitted in the form of either the high level or otherwise the low level. When the lighting circuit 120 receives the abnormality detection signal S1b having the middle level $V_{MID}$, the lighting circuit 120 instructs the light source 10 to operate normally. When the abnormality detection signal S1b deviates from the middle level $V_{MID}$, the lighting circuit 120 executes a suitable protection operation such as turning off the light source 10.

That is to say, in the signal design for the abnormality detection signal S1b, the asserted level that indicates an abnormality is assigned to the middle level $V_{MID}$, which cannot occur when an abnormality such as an open-circuit fault, a short-circuit fault, or the like has occurred. Furthermore, the negated level that indicates the normal state is assigned to the voltage level that can occur when such an abnormality has occurred. Such an arrangement is capable of executing a suitable protection operation even when a short-circuit fault or an open-circuit fault has occurred in the line via which the abnormality detection signal S1a is to be transmitted, in addition to when the abnormality detection signal S1a indicates an abnormality (when the abnormality detection signal S1a is asserted).

The judgment unit 40b further includes a COD (catastrophic optical damage) detection circuit 44. COD represents a malfunction that occurs in the laser diode 12 involving drastic degradation of the output light amount without change in the electrical characteristics.

The COD detection circuit 44 compares the output V22 of the second preamplifier 38 with the threshold voltage $V_{THH}$. When V22<$V_{THH}$, the COD detection circuit 44 generates a COD detection signal S2a set to the high-impedance state. Conversely, when V22>$V_{THH}$, the COD detection circuit 44 generates the COD detection signal S2a set to the low level $V_{GND}$. If a non-light-emission state has occurred in the light source 10 due to the occurrence of the COD, the current that flows through the second photodiode PD2 becomes substantially zero, which sets the second detection signal V22 to the power supply voltage $V_{CC}$ level. Accordingly, by setting the threshold voltage $V_{THH}$ to a value in the vicinity of the power supply voltage $V_{CC}$, the COD detection circuit 44 is capable of detecting such a COD.

A second level shift circuit 46b has the same configuration as that of the first level shift circuit 46a. The level shift circuit 46b shifts the level of an output S2a of the COD detection circuit 44 so as to generate a COD detection signal S2b that can switch between a middle level $V_{MID}$ and the ground level $V_{GND}$.

Figure 17:
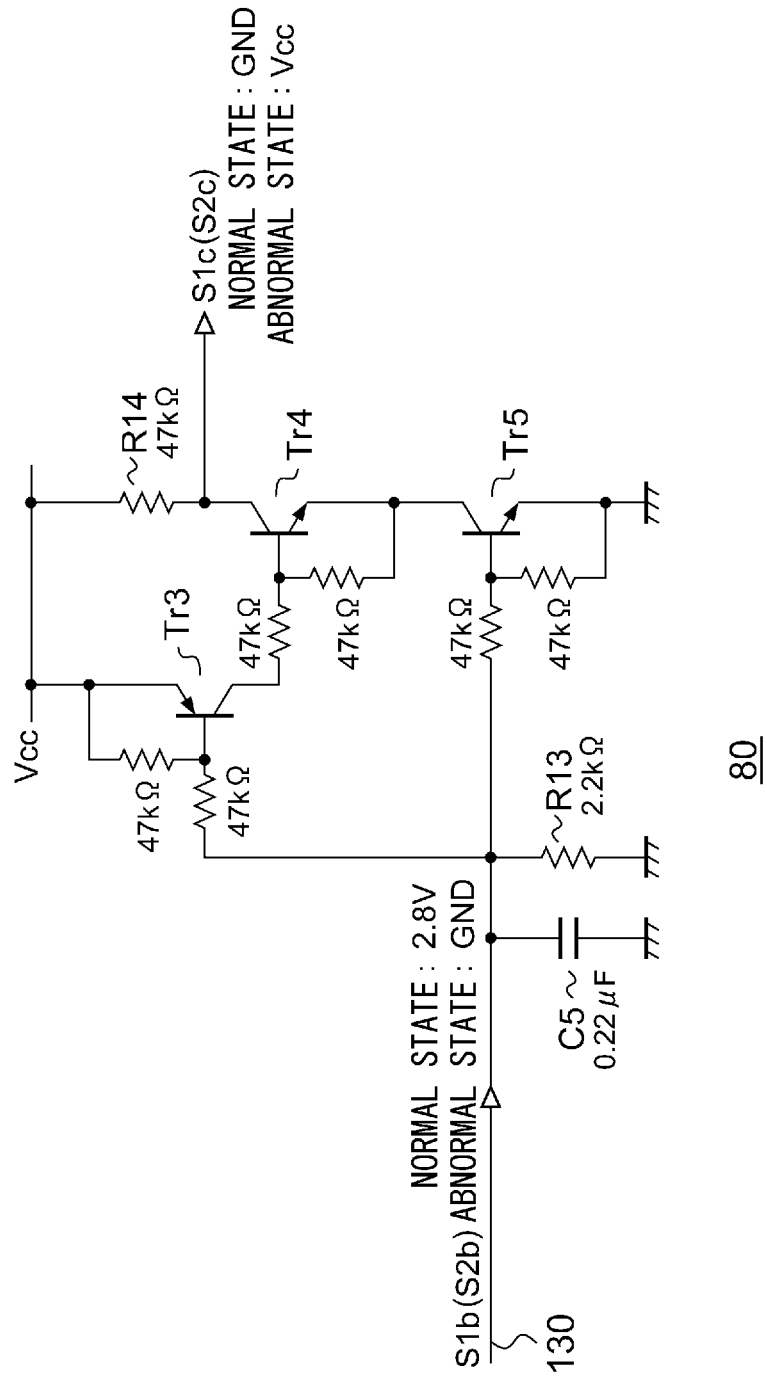
FIG. 17 is a circuit diagram showing a reception circuit.

FIG. 17 is a circuit diagram showing a reception circuit. A reception circuit 80 is mounted on the lighting circuit 120. The reception circuit 80 receives the abnormality detection signal S1b from the abnormality detector 30d shown in FIG. 16 via the signal line 130. The reception circuit 80 mainly includes transistors Tr3 through Try and resistors R13 and R14. A capacitor C5 is provided in order to protect the circuit from electromagnetic noise. The resistor R13 is provided in order to secure a contact current.

When the abnormality detection signal S1b is set to the middle level $V_{MID}$ (≈2.8 V) that indicates the normal state, the transistors Tr3 and Tr4 are turned on, and the transistor Tr5 is turned on. In this case, the output S1c of the reception circuit 80 is set to the low-level voltage $V_{GND}$ that indicates the normal state.

When the abnormality detection signal S1b is set to the ground voltage $V_{GND}$ that indicates an abnormality, the transistors Tr3 and Tr4 remain turned on, and the transistor Tr5 is turned off. In this case, the output S1c of the reception circuit 80 is set to the high-level voltage $V_{CC}$ that indicates the occurrence of an abnormality.

If the signal line 130 is short-circuited to the power supply voltage line, the transistors Tr3 and Tr4 are turned off. In this case, the output S1c of the reception circuit 80 is set to the high-level voltage $V_{CC}$, which is the same as that in a case in which the abnormality detection signal S1b indicates an abnormality. If the signal line 130 is short-circuited to the ground line, the abnormality detection signal S1b is set to the same value as that of the ground voltage $V_{GND}$. In this case, the output S1c of the reception circuit 80 is set to the high-level voltage $V_{CC}$ that indicates the occurrence of an abnormality.

As described above, with the reception circuit 80 shown in FIG. 17, when the reception circuit 80 receives an input signal having the middle level $V_{MID}$, the reception circuit 80 generates the signal S1c having the first level ($V_{GND}$). When the reception circuit 80 receives an input signal having other levels (the power supply voltage $V_{CC}$ or otherwise the ground voltage $V_{GND}$) that differ from the middle level $V_{MID}$, the reception circuit 80 generates the signal S1c having the second level ($V_{CC}$). Also, the reception circuit for receiving the COD detection signal S2b may be configured in the same manner.

Description has been made above regarding an aspect of the present invention with reference to the third embodiment. The above-described third embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Fifth Modification

Figure 18:
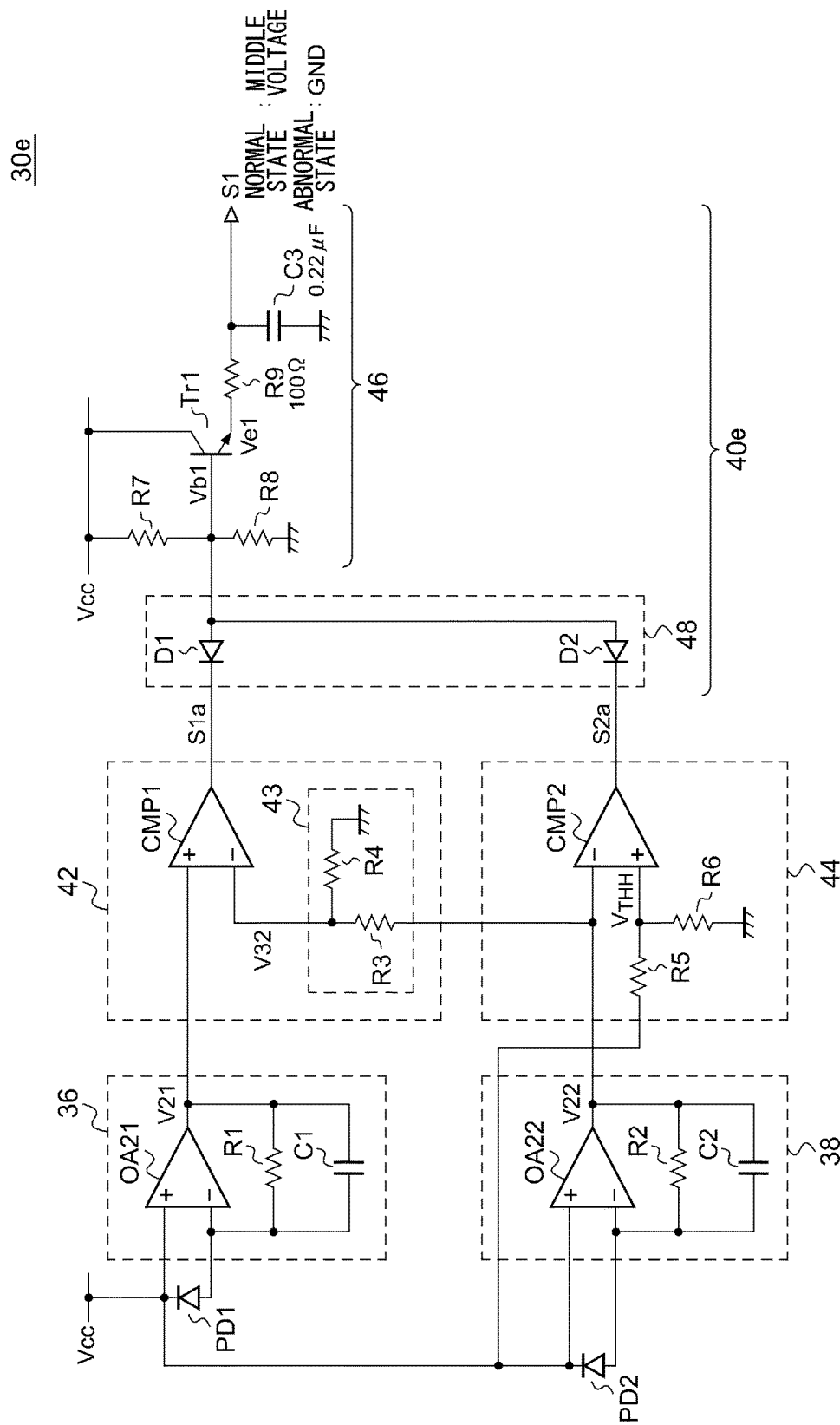
FIG. 18 is a circuit diagram showing an abnormality detector according to a modification.

FIG. 18 is a circuit diagram showing an abnormality detector 30e according to a fifth modification. Description has been made with reference to FIG. 16 regarding an arrangement in which the abnormality detector 30d is configured to transmit two abnormality detection signals S1b and S2b in a parallel manner via two signal lines 130. In contrast, with the abnormality detector 30e shown in FIG. 18, multiple abnormality detection signals are multiplexed by means of logical operation into a single abnormality detection signal, which is transmitted via a single signal line 130.

A logic gate 48 generates the logical OR of the output S1a of the phosphor abnormality detection circuit 42 and the output S2b of the COD detection circuit 44. For example, the logic gate 48 includes a pair of diodes D1 and D2 arranged such that their anodes are coupled so as to form a common anode. In a case in which the outputs of the voltage comparators CMP1 and CMP2 can switch between two levels, i.e., between the high level and the low level, the logic gate 48 may be configured as an OR gate. The level shift circuit 46 may have the same configuration as that of the first level shift circuit 46a described above.

When at least one from among the abnormality detection signal S1a and S1b is set to the low level $V_{GND}$ that indicates an abnormality, the base voltage of the transistor Tr1 falls, which turns off the transistor Tr1. As a result, the abnormality detection signal S1 is set to the low level $V_{GND}$.

When the abnormality detection signals S1a and S1b are all set to the high-impedance state that indicates the normal state, the base voltage Vb1 of the transistor Tr1 rises. In this case, the emitter electric potential Ve1 of the transistor Tr1 is set to (Vb1−Vbe). In this state, the abnormality detection signal S1 is set to the middle voltage $V_{MID}$ level.

With the abnormality detector 30e shown in FIG. 18, such an arrangement allows the number of signal lines to be reduced. Such an abnormality detector 30e is effectively applicable to a case in which there is no need to identify the kind of factor that has caused the occurrence of an abnormality.

Sixth Modification

Description has been made with reference to FIGS. 14, 16, and 18 regarding an arrangement configured to transmit the abnormality detection signal S1 that can switch between two states. However, the present invention is not restricted to such an arrangement. For example, the judgment unit 40 may be mounted on the main circuit board on the lighting circuit 120 side. With such an arrangement, the outputs of the first preamplifier 36 and the second preamplifier 38 may be respectively transmitted via the respective signal lines.

Seventh Modification

Description has been made in the embodiment regarding an arrangement in which the judgment unit 40 is configured as the voltage comparator CMP1. However, the present invention is not restricted to such an arrangement. For example, after the first detection signal V1 and the second detection signal V2 are respectively converted into digital values D1 and D1 by means of an A/D converter, the judgment unit 40 may perform signal processing on the digital values D1 and D2 thus converted, so as to judge the presence or absence of an abnormality. In this case, the first preamplifier 36, the second preamplifier 38, and the A/D converter may be mounted on the sub-base member 128, and the judgement unit 40 may be mounted on a main circuit board. Also, the judgment unit 40 may be mounted on the sub-base member 128.

Eighth Modification

The method for providing the offset width ΔV described above with reference to FIG. 16 is not restricted to such a voltage dividing circuit 43. For example, the voltage comparator CMP1 may be configured to be capable of adjusting the input offset voltage. With such an arrangement, at least one from among the first detection signal V1 and the second detection signal V2 may be offset. Such an arrangement is capable of preventing false detection of an abnormality due to error factors such as noise or the like.

Ninth Modification

With the abnormality detector 30c shown in FIG. 14, at least one from among the first detection signal V1 and the second detection signal V2 may be offset, which is also effective as a modification. Specifically, the second detection signal V2 shown in FIG. 5A may be offset toward the positive electric potential side. In order to provide such a function, a fixed voltage that corresponds to the offset width ΔV may preferably be applied to the non-inverting input terminal (+) of the first operational amplifier OA1.

Figure 19:
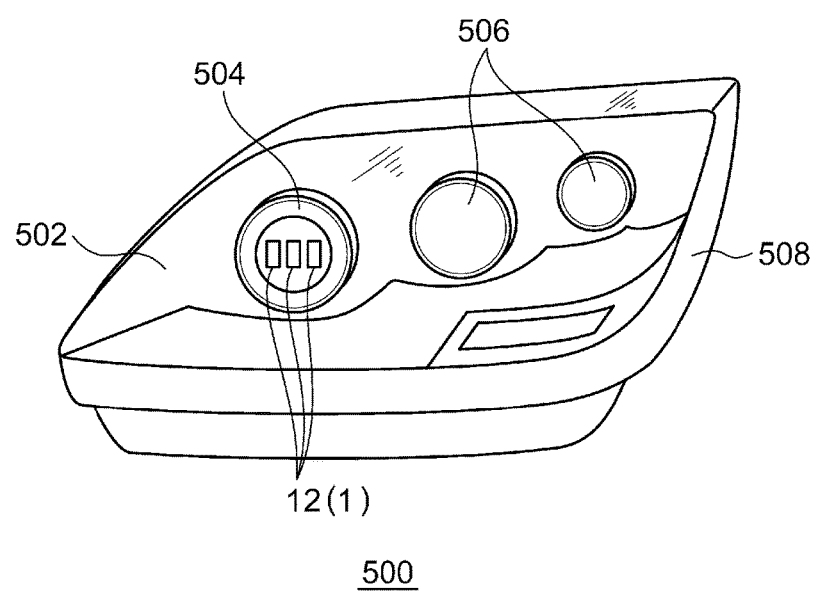
FIG. 19 is a perspective view showing a lamp unit including the vehicular lighting device according to the embodiment.

Lastly, description will be made regarding the usage of the vehicular lighting device 1. FIG. 19 is a perspective view of a lamp unit (lamp assembly) 500 including the vehicular lighting device 1 according to the embodiment. The lamp unit 500 includes a transparent cover 502, a high-beam unit 504, a low-beam unit 506, and a housing 508. The aforementioned vehicular lighting device 1 may be employed as the high-beam unit 504, for example. The vehicular lighting device 1 includes one or multiple light sources 10. The vehicular lighting device 1 may be configured as the low-beam unit 506 instead of or in addition to being configured as the high-beam unit 504.

Description has been made regarding the present invention with reference to the embodiments using specific terms. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

What is claimed is:

1. An abnormality detector for a light source, the light source being furnished with a laser diode for emitting excitation light, and a phosphor for emitting fluorescent light by undergoing excitation by the excitation light, wherein the light source is configured to generate white output light containing the excitation light and fluorescent light spectra, abnormality detector comprising:
    a first photosensor structured to be sensitive to the excitation light's wavelength and to be substantially insensitive to the fluorescent light's wavelength, and to receive a part of the output light so as to generate a first current that corresponds to an amount of received light;
    a second photosensor structured to be sensitive to the fluorescent light's wavelength, to be substantially insensitive to the excitation light's wavelength, and to receive a part of the output light so as to generate a second current that corresponds to an amount of received light;
    a first current/voltage conversion circuit comprising a first resistor arranged in a path of the first current, and structured to output a first detection voltage that corresponds to a voltage drop across the first resistor; and
    a second current/voltage conversion circuit comprising a second resistor arranged in a path of the second current, and structured to output a second detection voltage that corresponds to a voltage drop across the second resistor; and
    a judgment unit structured to assert an abnormality detection signal (i) if a relation between magnitudes of the 5 first detection voltage and the second detection voltage has reversed, or otherwise (ii) if the first detection voltage deviates from a voltage range in which the first detection voltage can be obtained at normal times.

2. The abnormality detector according to claim 1, wherein, (iii) when the second detection voltage deviates from a voltage range in which the second detection voltage can be obtained at normal times, the judgment unit asserts the abnormality detection signal.

3. The abnormality detector according to claim 1, wherein the voltage range boundaries are generated by dividing a power supply voltage supplied to the abnormality detector.

4. The abnormality detector according to claim 1, wherein the judgment unit is structured to offset at least one from between the first detection voltage and the second detection voltage so as to increase a difference between them, and to monitor a magnitude relation between the first and second detection voltages thus offset.

5. The abnormality detector according to claim 1, wherein:
    the first current/voltage conversion circuit and the second current/voltage conversion circuit are each configured as an inverting converter;
    the first photosensor comprises a first photodiode,
    the second photosensor comprises a second photodiode,
    wherein the first photodiode and the second photodiode are configured in the form of a single photodiode module;
    the photodiode module comprises
    the first photodiode and the second photodiode arranged such that cathodes thereof are coupled so as to form a common cathode,
    a first anode terminal coupled to an anode of the first photodiode,
    a second anode terminal coupled to an anode of the second photodiode,
    a cathode terminal coupled to the common cathode, and a metal casing structured to be electrically insulated from the cathode terminal, the first anode terminal, and the second anode terminal; and the photodiode module is housed in a CAN package.

6. A vehicular lighting device comprising:
a light source; and
the abnormality detector according to claim 1, structured to detect an abnormality in the light source.

7. The abnormality detector according to claim 1, wherein:
the first photosensor comprises a first photodiode,
the second photosensor comprises a second photodiode,
wherein the first photodiode and the second photodiode are configured as a single photodiode module, the photodiode module comprising:
the first photodiode and the second photodiode arranged such that cathodes thereof are coupled so as to form a common cathode;
a first anode terminal coupled to an anode of the first photodiode;
a second anode terminal coupled to an anode of the second photodiode;
a cathode terminal coupled to the common cathode; and
a metal casing structured to be electrically insulated from the first anode terminal, the second anode terminal, and the cathode terminal; wherein
the photodiode module is housed in a CAN package.

8. An abnormality detector for a light source, the light source being furnished with a laser diode for emitting excitation light, and a phosphor for emitting fluorescent light by undergoing excitation by the excitation light, wherein the light source is configured to generate white output light containing the excitation light and fluorescent light spectra, the abnormality detector comprising:

a first photosensor structured to be sensitive to the excitation light's wavelength and to be substantially insensitive to the fluorescent light's wavelength, and to receive a part of the output light so as to generate a first current that corresponds to an amount of received light;

a second photosensor structured to be sensitive to the fluorescent light's wavelength, to be substantially insensitive to the excitation light's wavelength, and to receive a part of the output light so as to generate a second current that corresponds to an amount of received light;

a first current/voltage conversion circuit comprising a first resistor arranged in a path of the first current, and structured to output a first detection voltage that corresponds to a voltage drop across the first resistor; and a second current/voltage conversion circuit comprising a second resistor arranged in a path of the second current, and structured to output a second detection voltage that corresponds to a voltage drop across the second resistor; and a judgment unit structured to assert an abnormality detection signal (i) if a relation between magnitudes of the first detection voltage and the second detection voltage has reversed, or otherwise (iii) if the second detection voltage deviates from a voltage range in which the second detection voltage can be obtained at normal times.

* * * * *